United States Patent
Choung et al.

(10) Patent No.: US 12,120,938 B1
(45) Date of Patent: *Oct. 15, 2024

(54) METHODS OF FABRICATING OLED PANEL WITH INORGANIC PIXEL ENCAPSULATING BARRIER

(71) Applicant: Applied Materials, Inc., Santa Clara, CA (US)

(72) Inventors: Ji Young Choung, Hwaseong-si (KR); Dieter Haas, Santa Clara, CA (US); Yu-hsin Lin, Zhubei (TW); Jungmin Lee, Santa Clara, CA (US); Seong Ho Yoo, San Ramon, CA (US); Si Kyoung Kim, Gwangju-si (KR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/390,720

(22) Filed: Dec. 20, 2023

Related U.S. Application Data

(63) Continuation of application No. 18/545,676, filed on Dec. 19, 2023, which is a continuation of application (Continued)

(51) Int. Cl.
    *H10K 59/80* (2023.01)
    *H10K 59/122* (2023.01)
    *H10K 59/173* (2023.01)

(52) U.S. Cl.
    CPC ......... *H10K 59/873* (2023.02); *H10K 59/122* (2023.02); *H10K 59/173* (2023.02)

(58) Field of Classification Search
    CPC ... H10K 59/122; H10K 59/173; H10K 59/873
    See application file for complete search history.

(56) References Cited

U.S. PATENT DOCUMENTS 5,952,037 A * 9/1999 Nagayama ........... H10K 50/805
                                                   427/404
6,060,728 A     5/2000 Ghosh et al.
(Continued)

FOREIGN PATENT DOCUMENTS

CN     105742311 A     7/2016
CN     106206620 A    12/2016
(Continued)

OTHER PUBLICATIONS

International Search Report/Written Opinion issued to PCT/US2021/021077 on Jun. 23, 2021.
(Continued)

*Primary Examiner* — Shaun M Campbell
(74) *Attorney, Agent, or Firm* — Patterson + Sheridan, LLP

(57) ABSTRACT

Embodiments described herein relate to sub-pixel circuits and methods of forming sub-pixel circuits that may be utilized in a display such as an organic light-emitting diode (OLED) display. The device includes a plurality of sub-pixels, each sub-pixel of the plurality of sub-pixels defined by adjacent pixel-defining layer (PDL) structures with inorganic overhang structures disposed on the PDL structures, each sub-pixel having an anode, organic light-emitting diode (OLED) material disposed on the anode, and a cathode disposed on the OLED material. The device is made by a process including the steps of: depositing the OLED material and the cathode by evaporation deposition, and depositing an encapsulation layer disposed over the cathode.

17 Claims, 23 Drawing Sheets

Related U.S. Application Data

No. 18/346,059, filed on Jun. 30, 2023, now Pat. No. 11,910,657, which is a continuation of application No. 18/314,915, filed on May 10, 2023, which is a continuation of application No. 18/049,868, filed on Oct. 26, 2022, now Pat. No. 11,690,255, which is a continuation of application No. 18/049,825, filed on Oct. 26, 2022, now Pat. No. 11,690,254, which is a continuation of application No. 17/498,482, filed on Oct. 11, 2021, now Pat. No. 11,476,313, which is a continuation of application No. 17/193,321, filed on Mar. 5, 2021, now abandoned, and a continuation of application No. 17/193,347, filed on Mar. 5, 2021, now Pat. No. 11,610,952.

(60) Provisional application No. 63/084,445, filed on Sep. 28, 2020, provisional application No. 63/075,028, filed on Sep. 4, 2020, provisional application No. 63/075,025, filed on Sep. 4, 2020.

(56) References Cited

U.S. PATENT DOCUMENTS

| | | | |
|---|---|---|---|
| 6,476,988 B1 | 11/2002 | Yudasaka | |
| 8,686,629 B2 | 4/2014 | Oh et al. | |
| 8,987,717 B2 | 3/2015 | Kang | |
| 9,324,962 B2 | 4/2016 | Kim | |
| 9,337,244 B2 | 5/2016 | Hatano et al. | |
| 10,170,526 B1* | 1/2019 | Yang | H10K 71/00 |
| 10,580,843 B2 | 3/2020 | Zhao et al. | |
| 10,615,231 B2 | 4/2020 | Wu et al. | |
| 11,610,952 B2* | 3/2023 | Choung | H10K 59/173 |
| 11,610,954 B1* | 3/2023 | Lin | H10K 50/844 |
| 11,665,931 B2* | 5/2023 | Chen | H10K 59/173 257/40 |
| 11,690,255 B2* | 6/2023 | Choung | H10K 59/173 257/40 |
| 2004/0169468 A1* | 9/2004 | Peng | H10K 59/8794 313/504 |
| 2004/0180457 A1* | 9/2004 | Birnstosk | H10K 59/35 438/22 |
| 2009/0009069 A1 | 1/2009 | Takata | |
| 2012/0217516 A1* | 8/2012 | Hatano | H10K 50/8428 257/E33.062 |
| 2014/0131743 A1 | 5/2014 | Jiang et al. | |
| 2015/0060809 A1 | 3/2015 | Kim et al. | |
| 2017/0194596 A1* | 7/2017 | Shen | H10K 50/846 |
| 2019/0058020 A1 | 2/2019 | Tsai et al. | |
| 2019/0088730 A1 | 3/2019 | Lee et al. | |
| 2019/0348482 A1 | 11/2019 | Bae et al. | |
| 2020/0295310 A1* | 9/2020 | Moon | H10K 59/1315 |
| 2021/0135150 A1* | 5/2021 | Wang | H10K 50/824 |

FOREIGN PATENT DOCUMENTS

| | | |
|---|---|---|
| CN | 108735791 A | 11/2018 |
| CN | 109860239 A | 6/2019 |
| CN | 110494986 A | 11/2019 |
| EP | 3026725 A1 | 6/2016 |
| EP | 20210864841 A1 | 7/2023 |
| JP | 2008135325 A | 6/2008 |
| JP | 2012190794 A | 10/2012 |
| JP | 2016225319 A | 12/2016 |
| KR | 20140085979 A | 7/2014 |
| KR | 20150025902 A | 3/2015 |
| KR | 20150067974 A | 6/2015 |
| KR | 20150042989 A | 11/2015 |
| KR | 20160017339 A | 2/2016 |
| KR | 20160062261 A | 6/2016 |
| KR | 20170003298 A | 1/2017 |

OTHER PUBLICATIONS

International Search Report/Written Opinion issued to PCT/US2021/021097 on Jul. 1, 2021.
Chinese Office Action dated Jul. 14, 2023, for CN Application No. 202180005553.4.
Chinese Office Action issued to Patent Application No. 202180005553.4 on Jul. 8, 2023.
China Office Action issued to Patent Application No. 202180005553.4 on Oct. 13, 2023.
Korean Notice of Sumission of Third Party Oberservation issued to Patent Application No. 10-2023-7011144 on Nov. 12, 2023.
EP Third Party Observation for application No. EP20210864841.
Chinease Office Action issued to Patent Application No. 202311158836.X on Nov. 11, 2023.
European Search Report issued to Patent Application No. 21864841.8 on Jan. 24, 2024.
Japanese Office Action issued to Application No. 2023-514739 on Feb. 28, 2024.
European Third Party Observation for application No. EP20210864841 on Feb. 9, 2024.
Korean Notice of Submission of Third Party Observations issued to Application No. 10-2023-7011144 on Mar. 7, 2024.

* cited by examiner

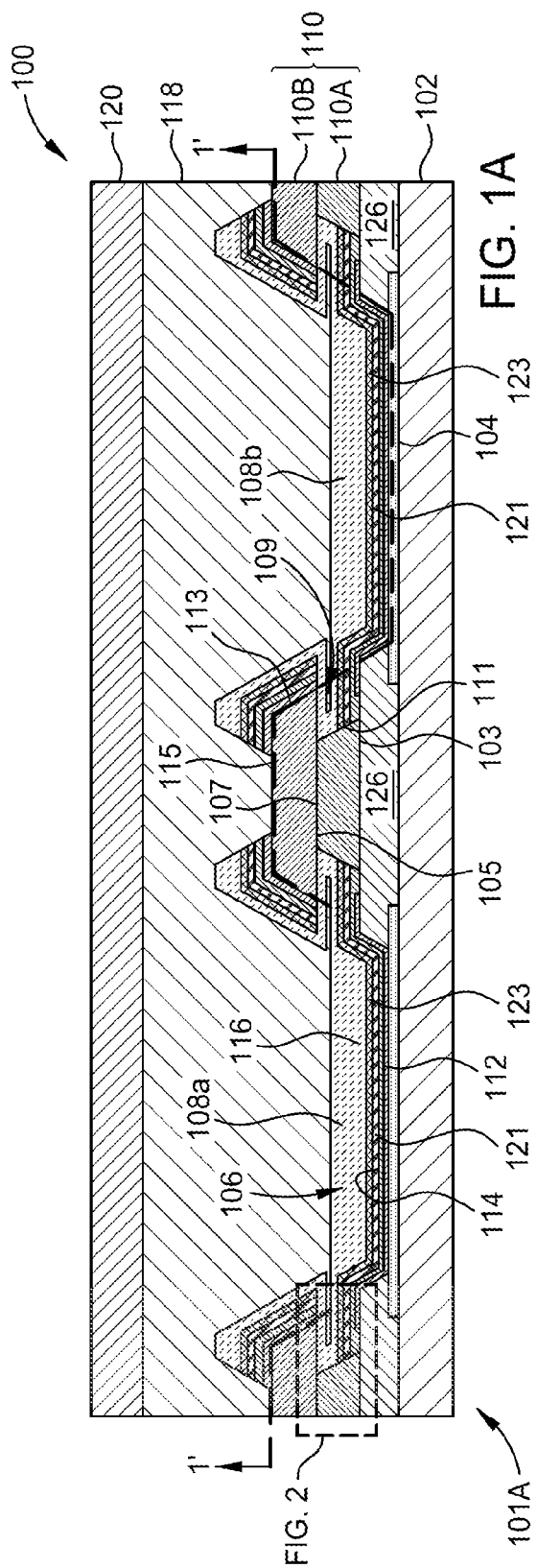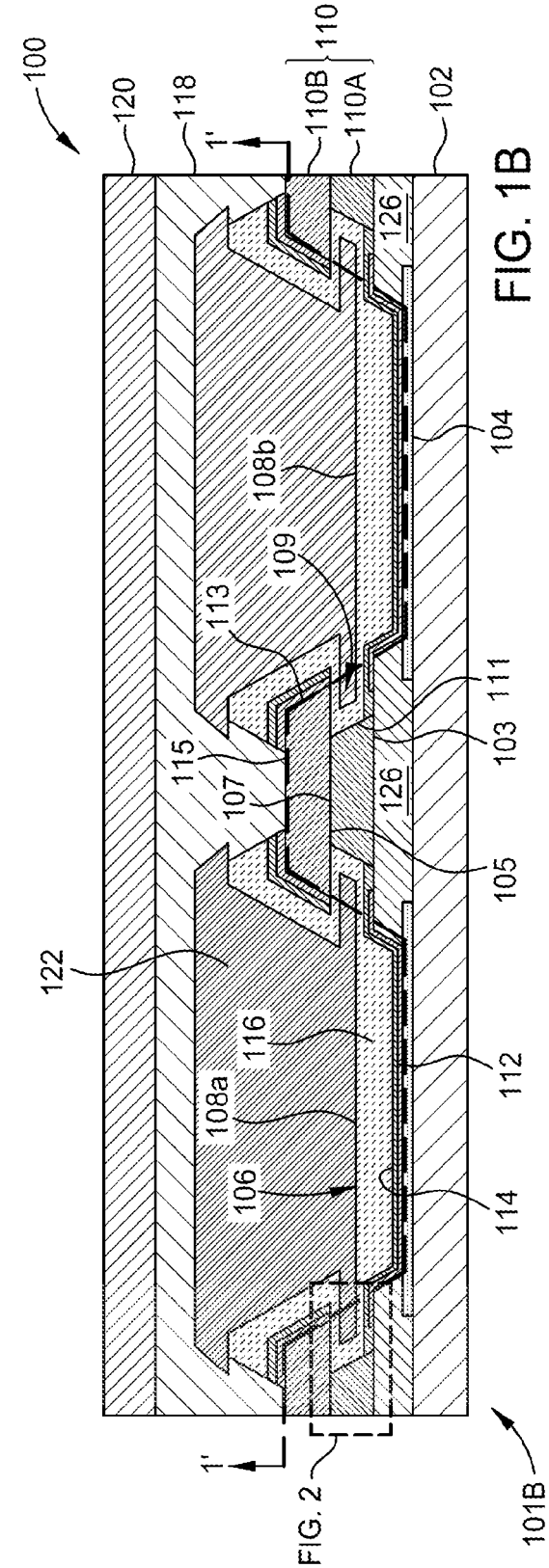

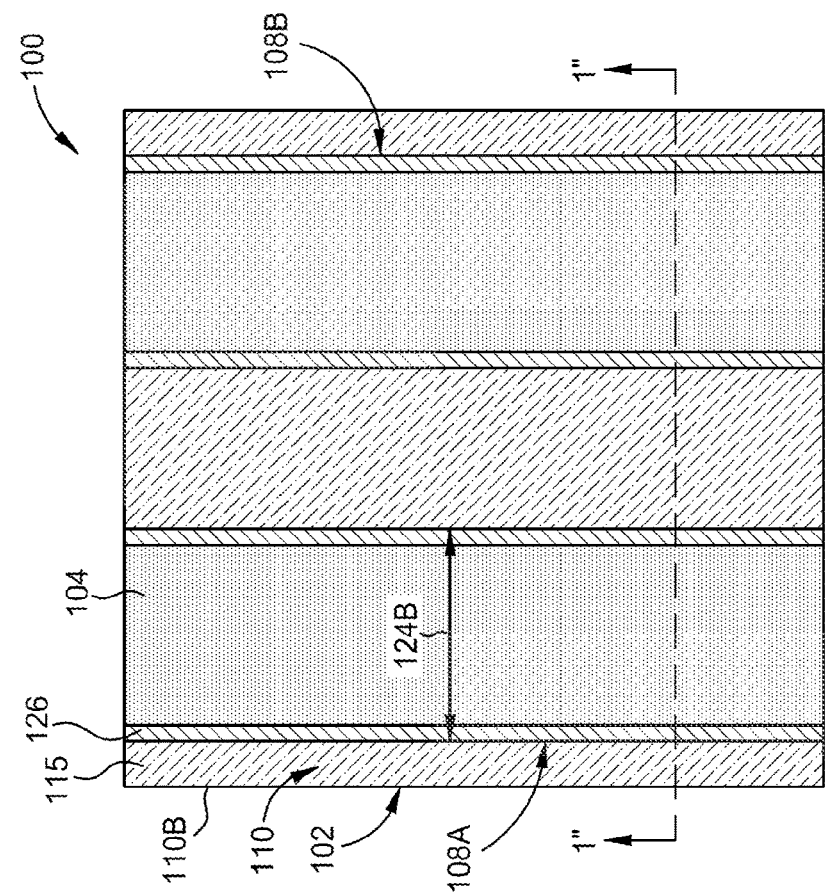
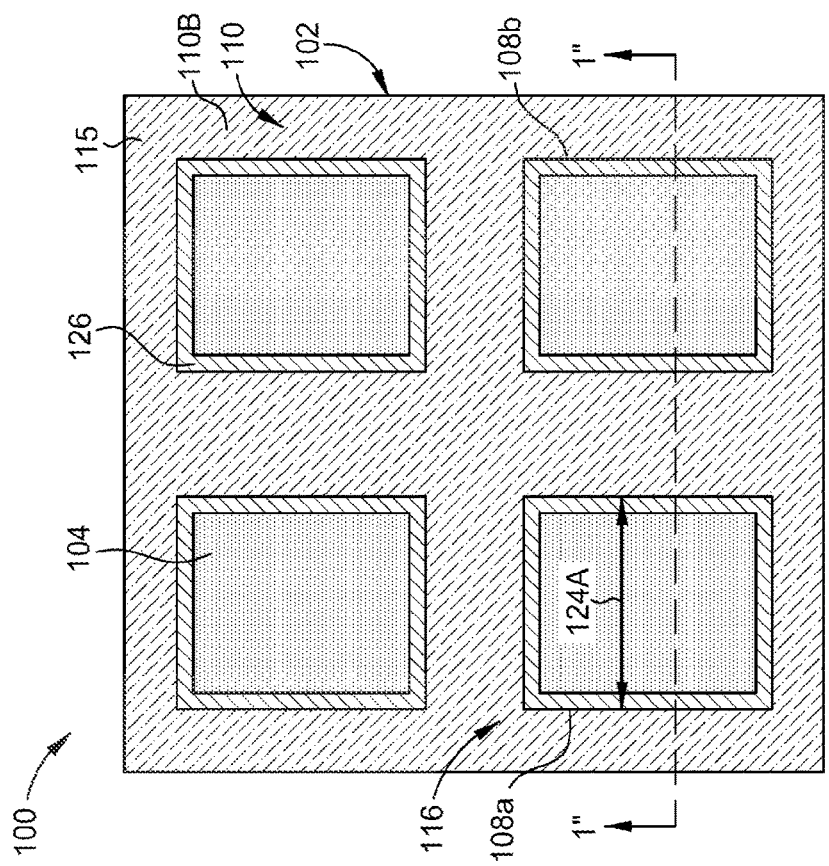

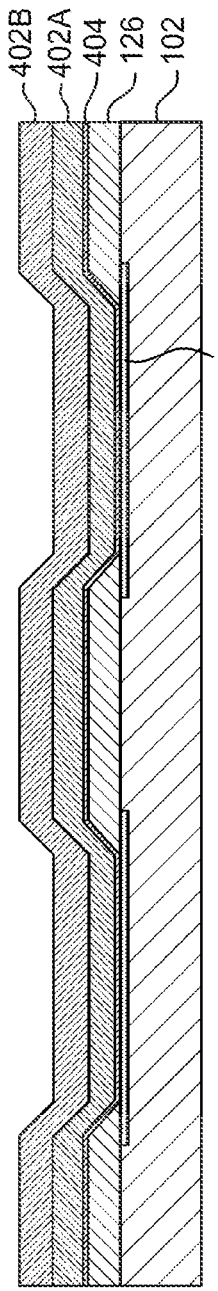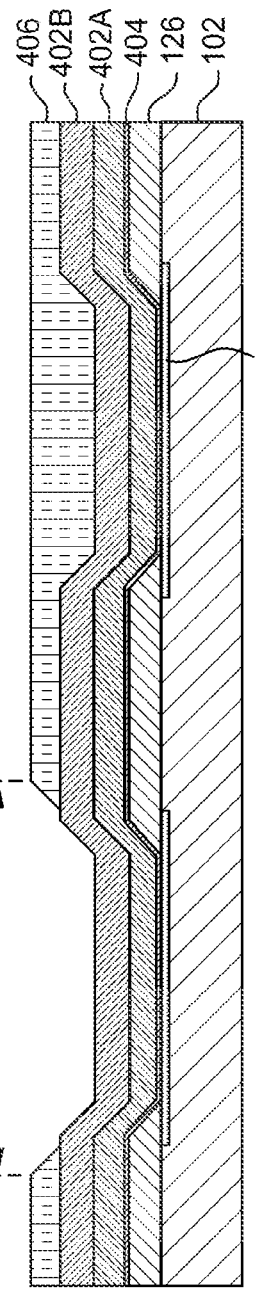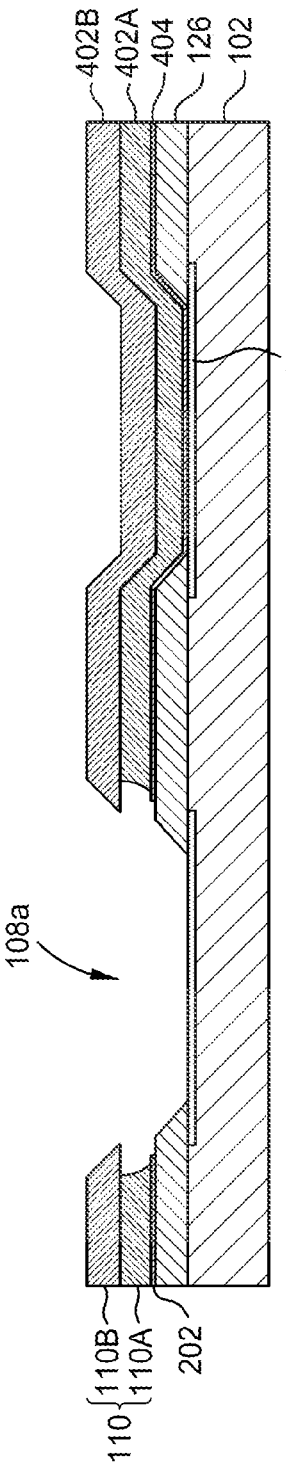

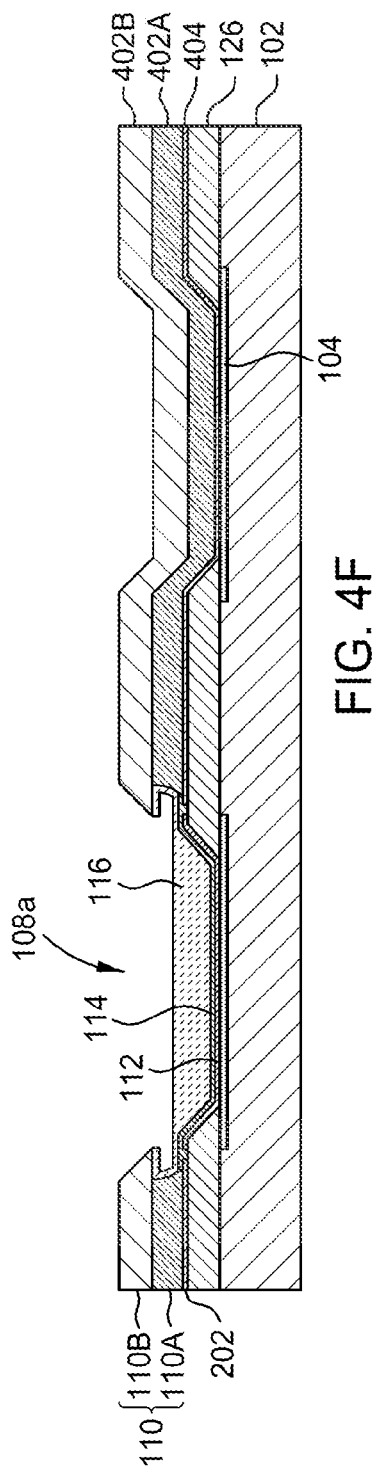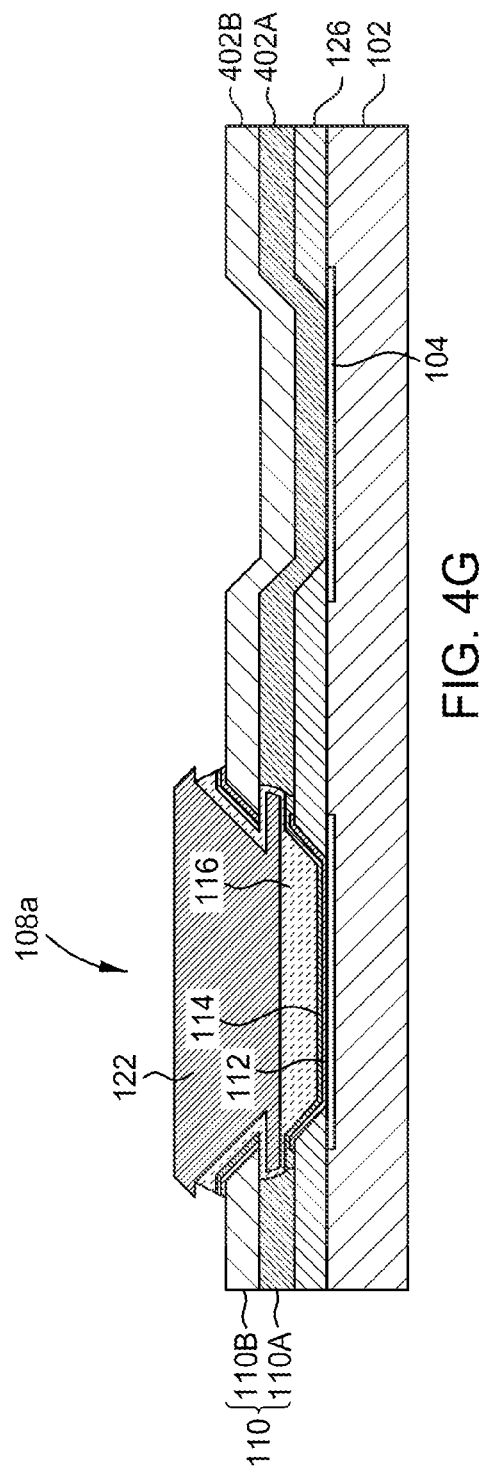

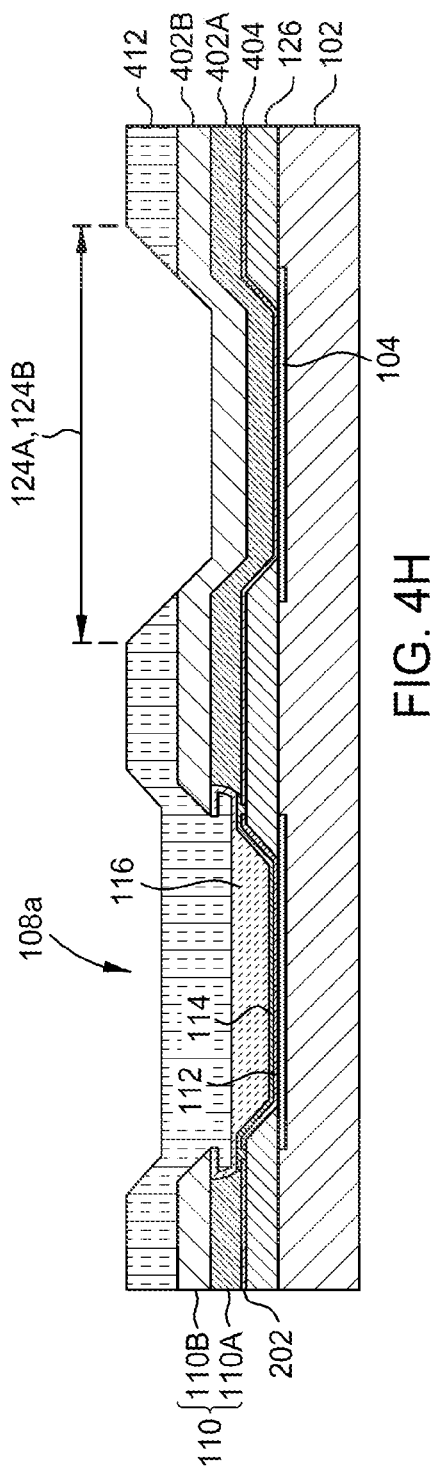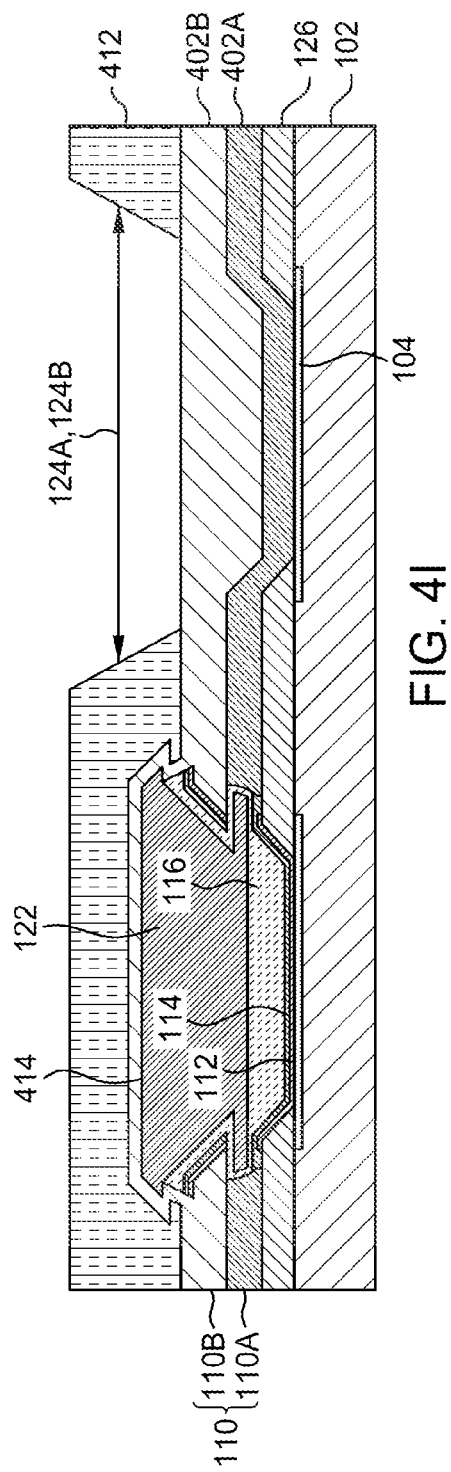

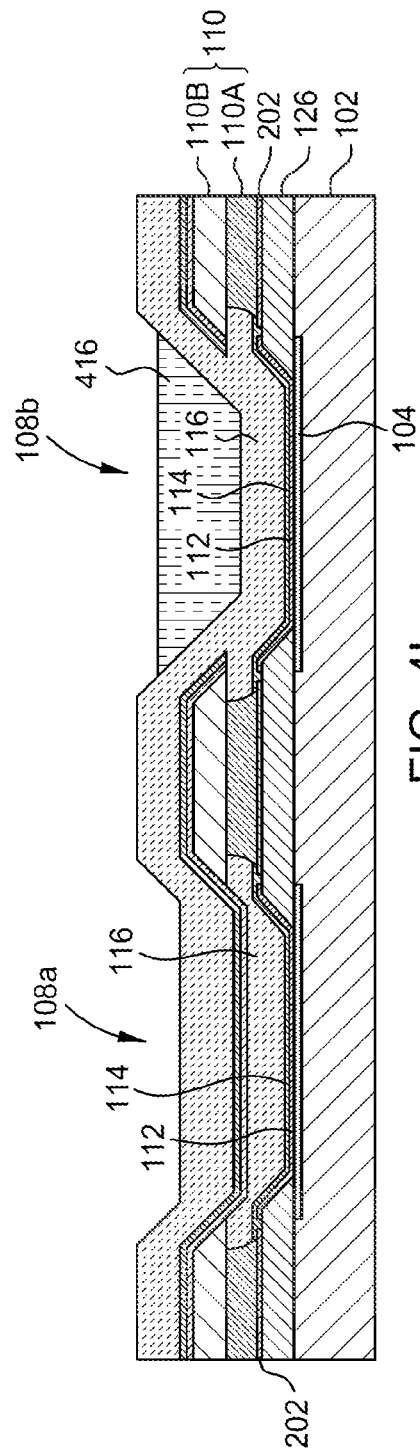
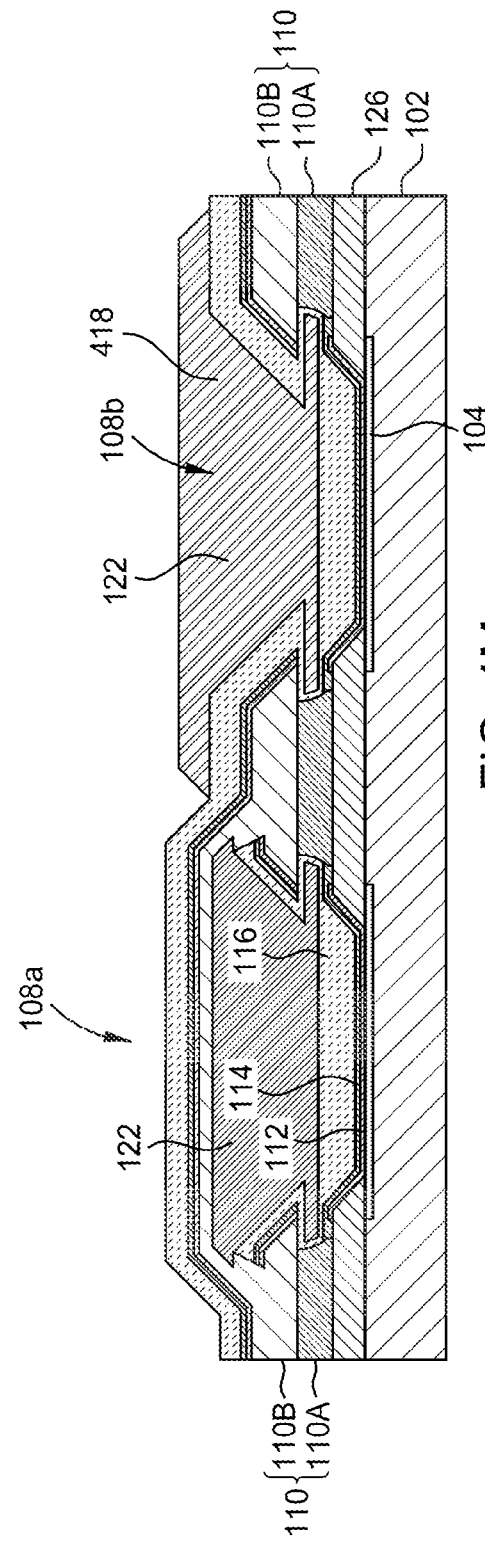

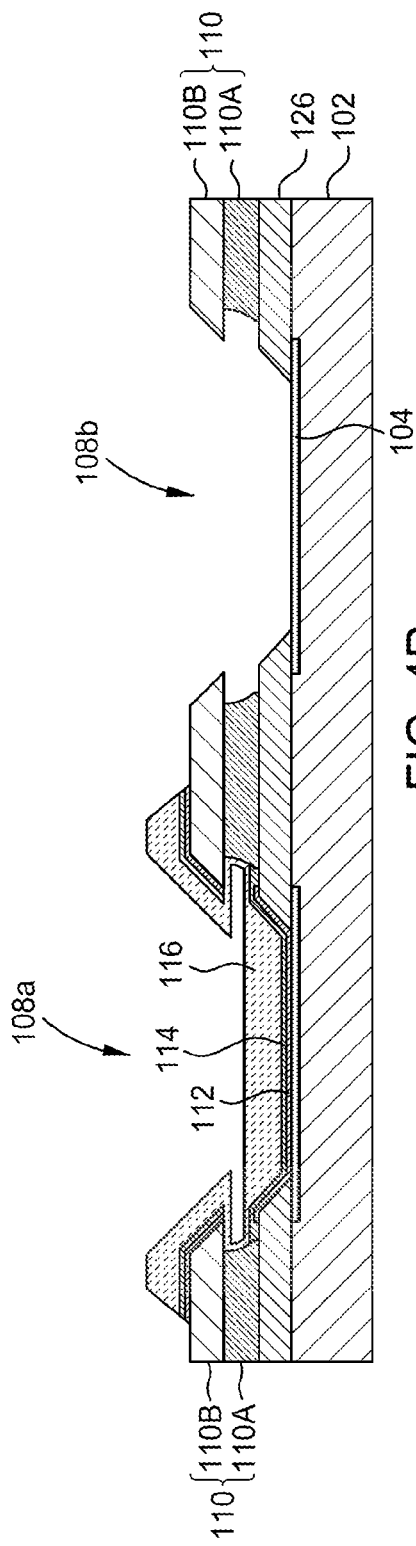
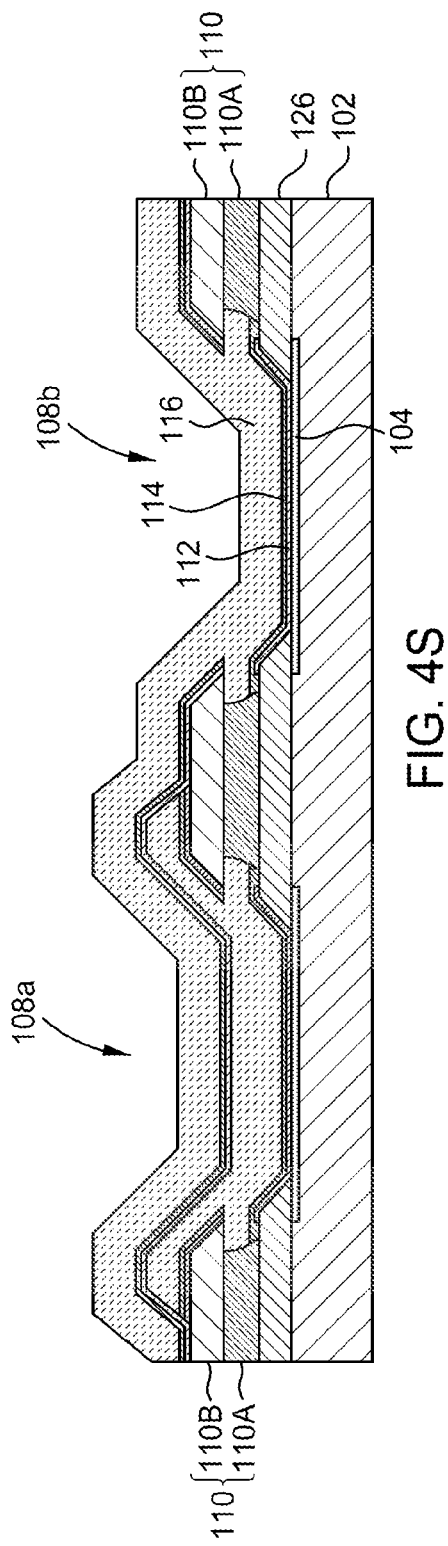
FIG. 4R
FIG. 4S

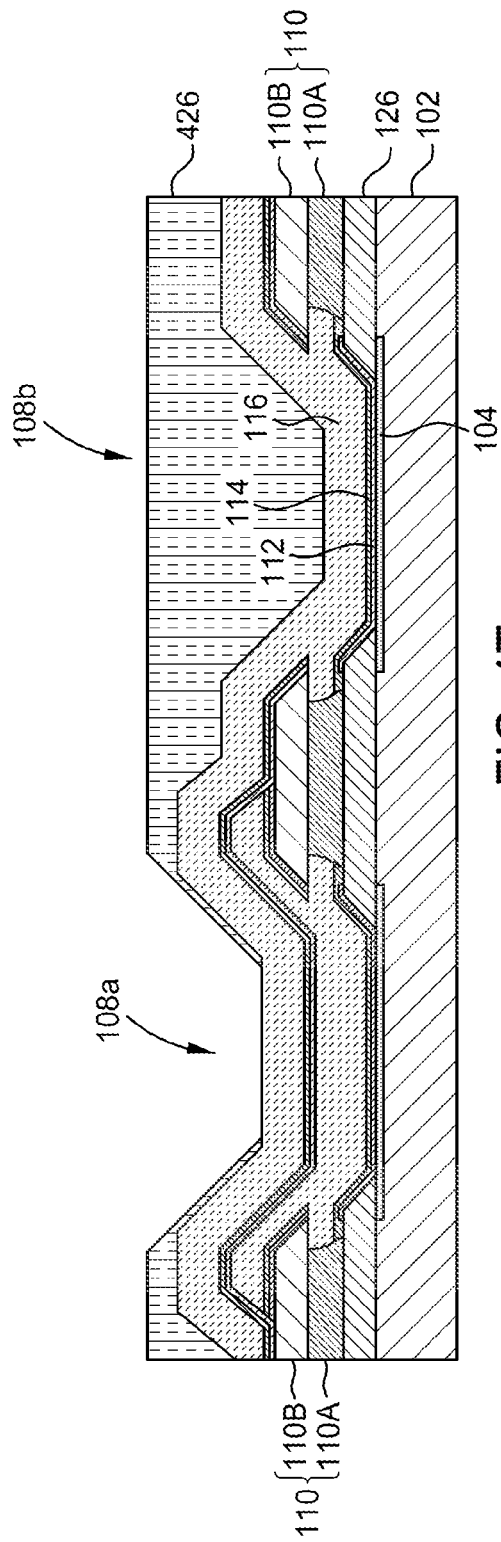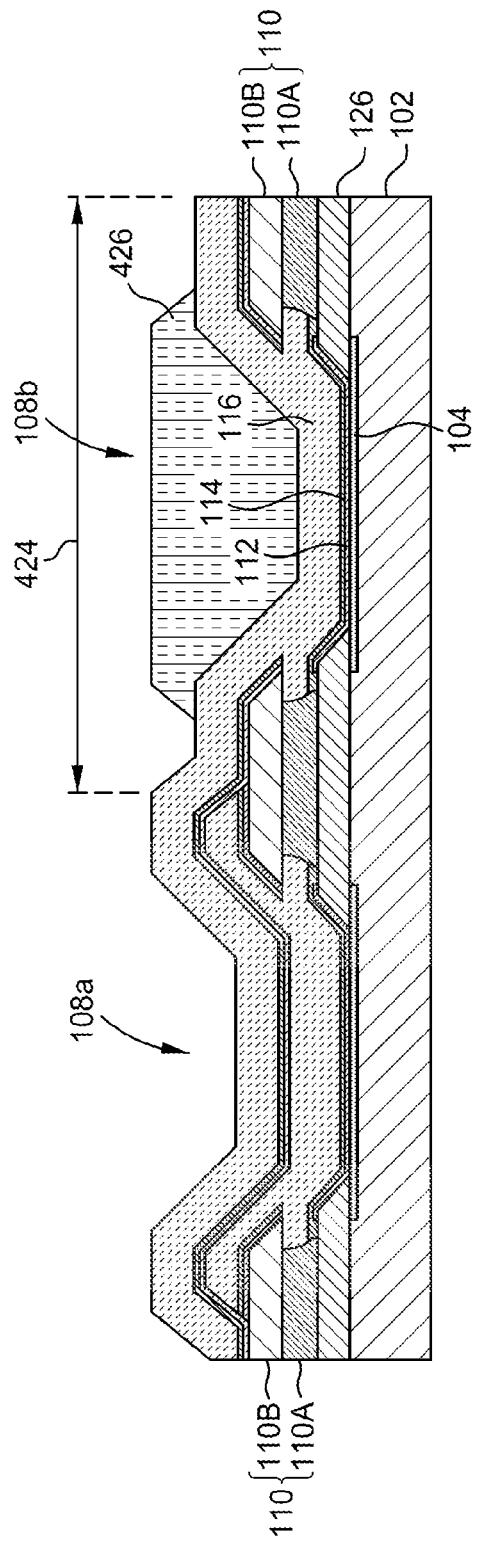

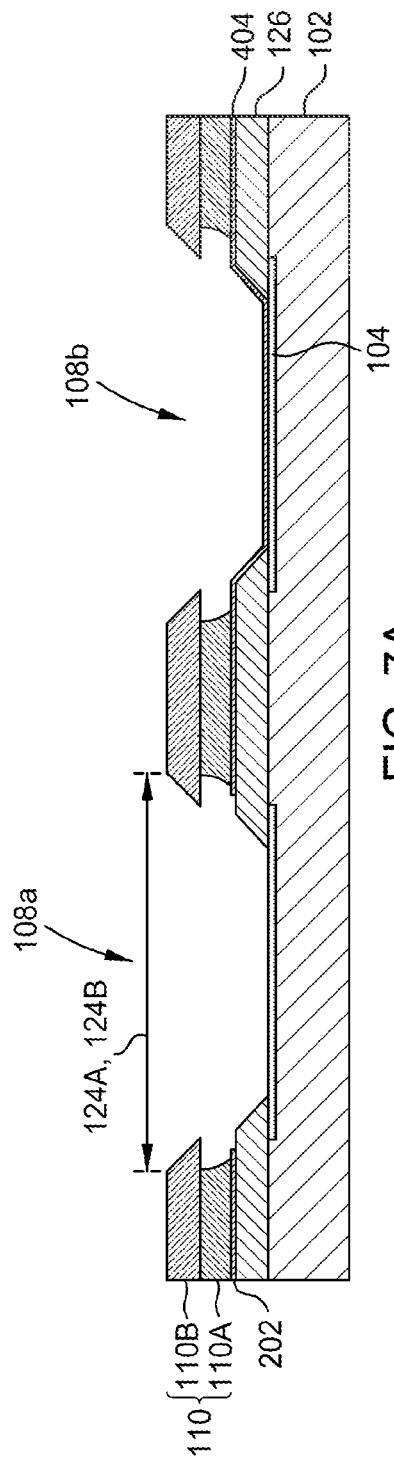
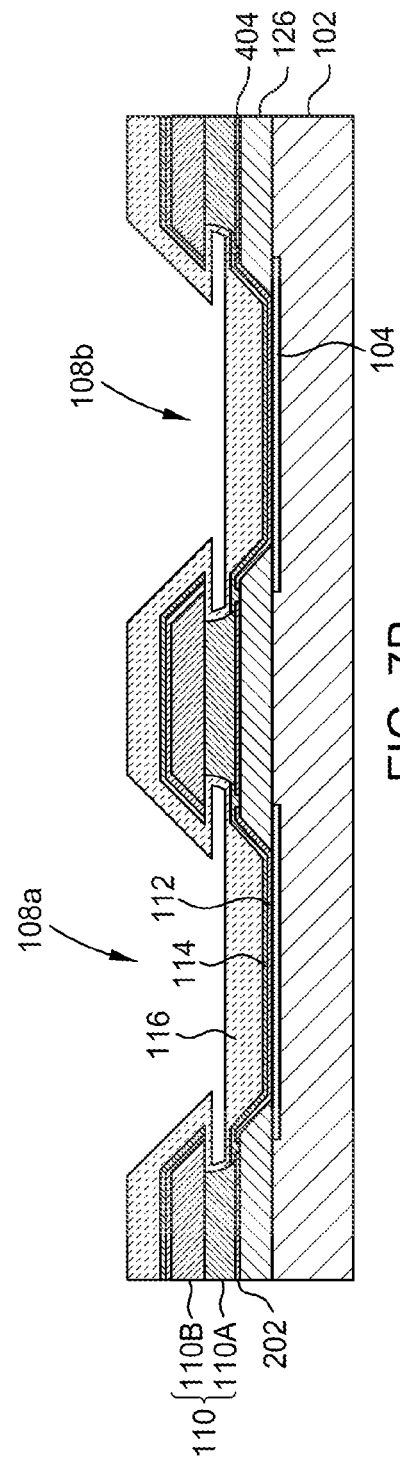

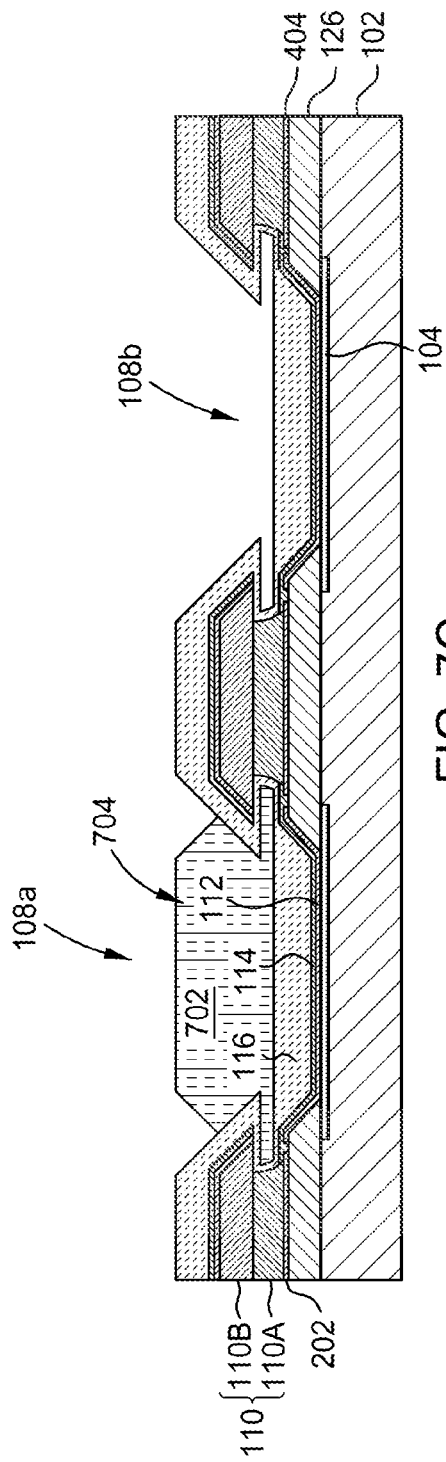
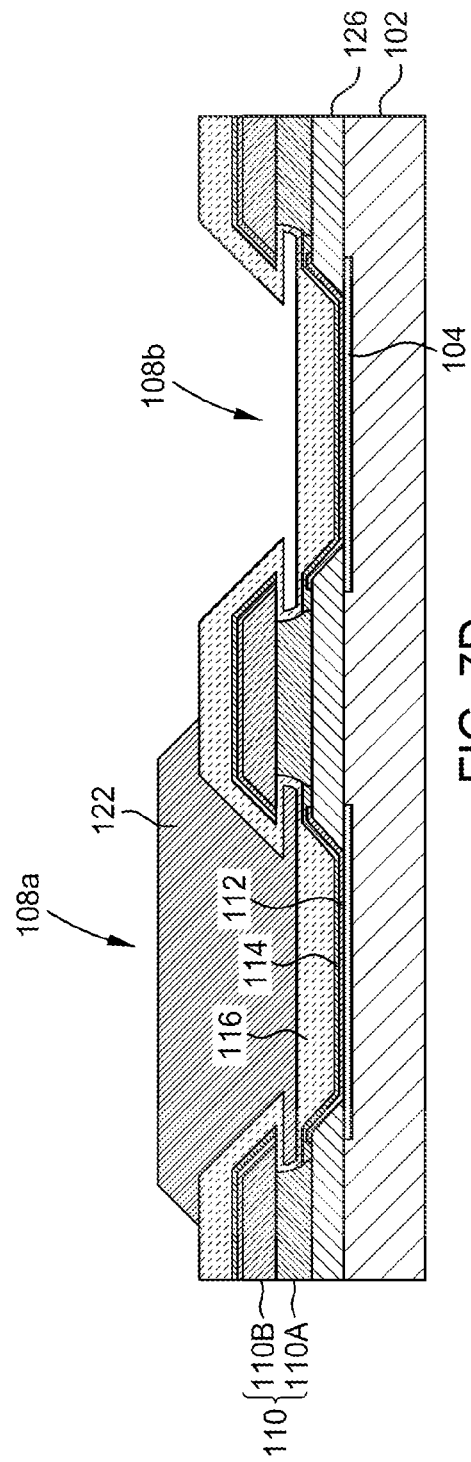

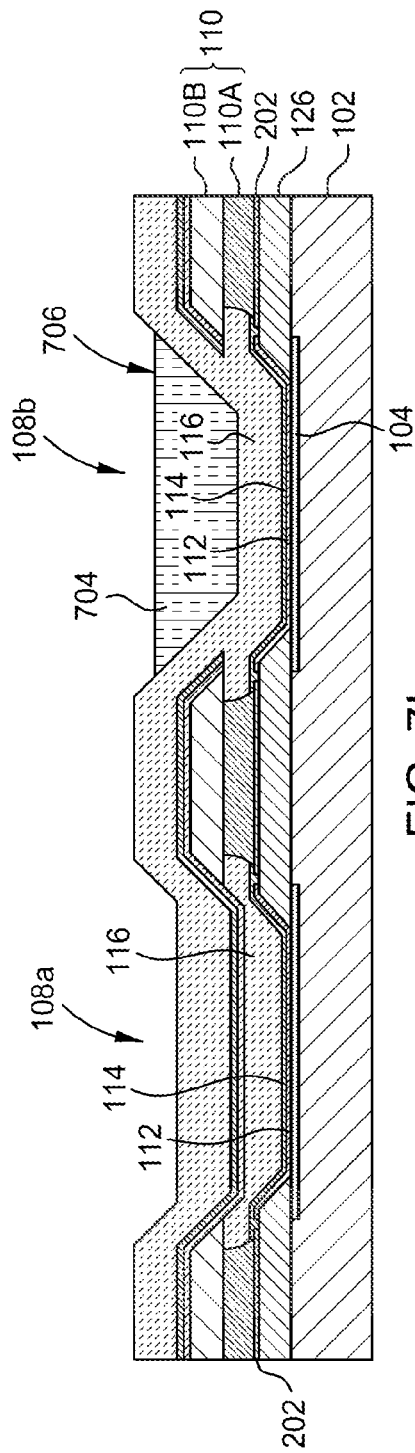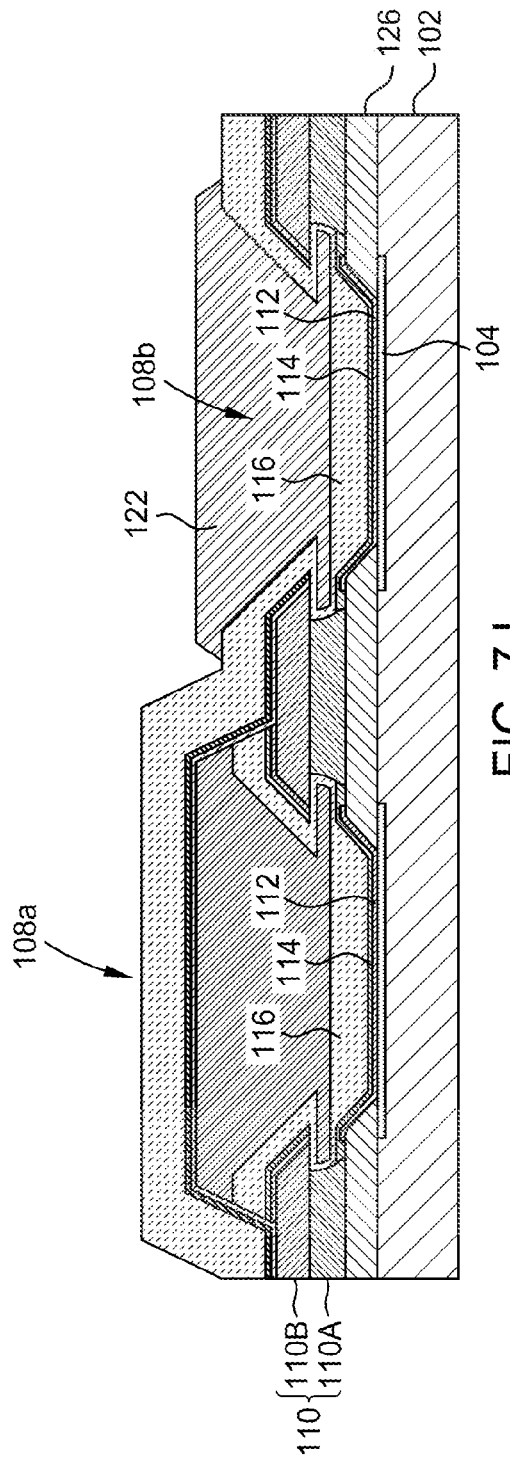

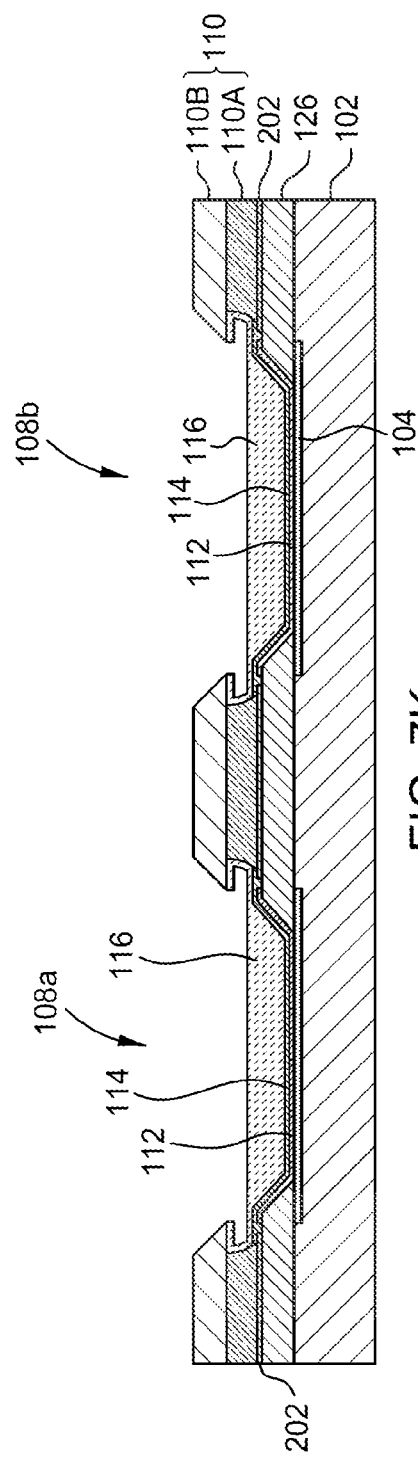
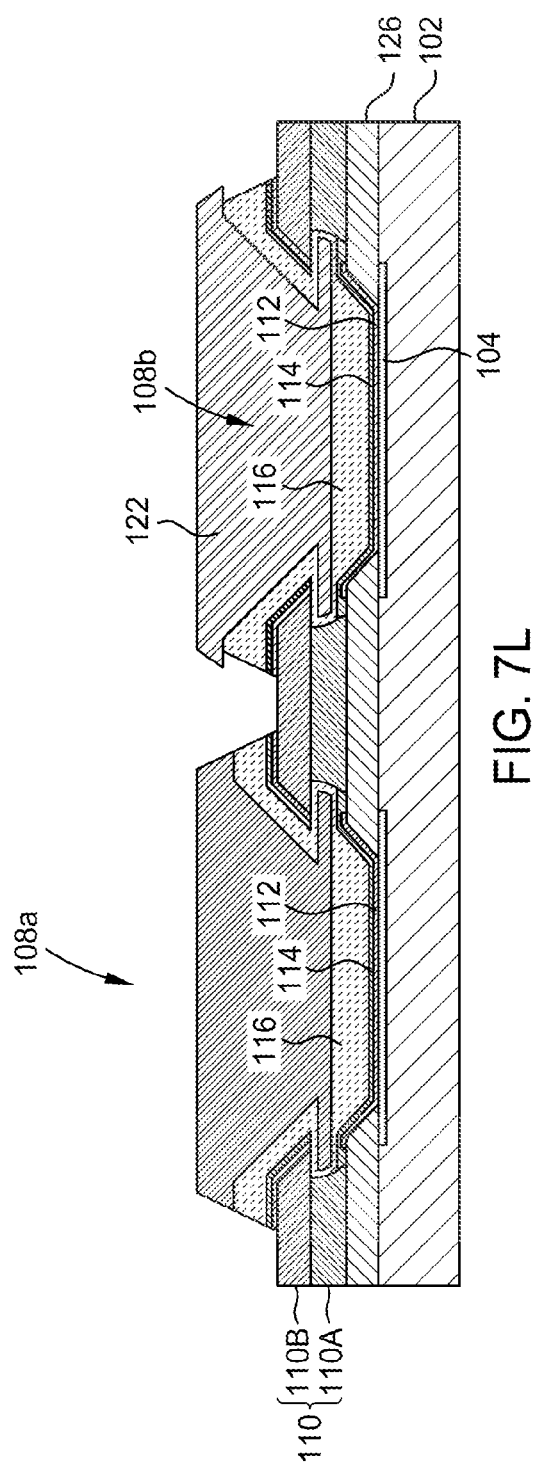

METHODS OF FABRICATING OLED PANEL WITH INORGANIC PIXEL ENCAPSULATING BARRIER

CROSS-REFERENCE TO RELATED APPLICATIONS

This Application is a continuation of U.S. patent application Ser. No. 18/545,676 filed Dec. 19, 2023 which is a continuation application of U.S. patent application Ser. No. 18/346,059, filed Jun. 30, 2023 which is a continuation of U.S. patent application Ser. No. 18/314,915, filed May 10, 2023, which is a continuation of U.S. patent application Ser. No. 18/049,868, filed Oct. 26, 2022, which is a continuation of U.S. patent application Ser. No. 18/049,825, filed Oct. 26, 2022, which is a continuation of U.S. patent application Ser. No. 17/498,482, filed on Oct. 11, 2021, which is a continuation of U.S. patent application Ser. No. 17/193,321, filed on Mar. 5, 2021, which claims priority to U.S. Provisional Patent Application Ser. No. 63/084,445, filed on Sep. 28, 2020, U.S. Provisional Patent Application Ser. No. 63/075,025, filed on Sep. 4, 2020, U.S. Provisional Patent Application Ser. No. 63/075,028, filed on Sep. 4, 2020, and said U.S. patent application Ser. No. 17/498,482, filed on Oct. 11, 2021, is a continuation of U.S. patent application Ser. No. 17/193,347, filed on Mar. 5, 2021, which claims priority to U.S. Provisional Patent Application Ser. No. 63/075,025, filed on Sep. 4, 2020. The aforementioned applications are herein incorporated by reference in their entirety.

BACKGROUND

Field

Embodiments described herein generally relate to a display. More specifically, embodiments described herein relate to sub-pixel circuits and methods of forming sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

OLED pixel patterning is currently based on a process that restricts panel size, pixel resolution, and substrate size. Rather than utilizing a fine metal mask, photo lithography should be used to pattern pixels. Currently, OLED pixel patterning requires lifting off organic material after the patterning process. When lifted off, the organic material leaves behind a particle issue that disrupts OLED performance. Accordingly, what is needed in the art are sub-pixel circuits and methods of forming sub-pixel circuits to increase pixel-per-inch and provide improved OLED performance.

SUMMARY

In one embodiment, a device is provided. The device includes a plurality of sub-pixels, each sub-pixel of the plurality of sub-pixels defined by adjacent pixel-defining layer (PDL) structures with inorganic overhang structures disposed on the PDL structures, each sub-pixel having an anode, organic light-emitting diode (OLED) material disposed on the anode, and a cathode disposed on the OLED material. The device is made by a process including the steps of: depositing the OLED material using evaporation deposition over a substrate, the OLED material disposed over and in contact with the anode, depositing a cathode using evaporation deposition, the cathode disposed over the OLED material and extending under the inorganic overhang structures adjacent to each sub-pixel, and depositing an encapsulation layer disposed over the cathode, the encapsulation layer extending under at least a portion of the inorganic overhang structures and along a sidewall of the inorganic overhang structures.

In another embodiment, a method of forming a device is provided. The method includes providing a substrate having an anode, adjacent pixel-defining layer (PDL) structures disposed over the substrate and defining sub-pixels of the device, and inorganic overhang structures disposed over an upper surface of the PDL structures, depositing OLED material using evaporation deposition in one or more of the sub-pixels of the device, and depositing a cathode over the OLED material, wherein the inorganic overhang structures define deposition angles such that both the OLED material and the cathode extend under the inorganic overhang structures.

In yet another embodiment, a method of forming a device is provided. The method includes providing a substrate having an anode, adjacent pixel-defining layer (PDL) structures disposed over the substrate and defining sub-pixels of the device, and inorganic overhang structures disposed on an upper surface of the PDL structures, each inorganic overhang structure has a lower portion disposed on a upper surface of a PDL structure of the PDL structures, and a upper portion disposed on the lower portion, the upper portion including an underside edge extending past a sidewall of the lower portion. An organic light-emitting diode (OLED) material is disposed over the anode by evaporation deposition, the OLED material having an OLED edge defined by the underside edge of the upper portion such that the OLED material does not contact the lower portion. A cathode disposed over the OLED material by evaporation deposition, the cathode having an cathode edge defined by the underside edge of the upper portion such that the extending under the upper portion and cathode contacts one or more of an assistant cathode disposed under the lower portion or part of the sidewall of the lower portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 1A is a schematic, cross-sectional view of a sub-pixel circuit having a plugless arrangement according to embodiments.

FIG. 1B is a schematic, cross-sectional view of a sub-pixel circuit having a plug arrangement according to embodiments.

FIG. 1C is a schematic, top sectional view of a sub-pixel circuit having a dot-type architecture according to embodiments.

FIG. 1D is a schematic, cross-sectional view of a sub-pixel circuit having a line-type architecture according to embodiments.

FIGS. 7A-7L are schematic, cross-sectional views of a substrate during a method for forming a sub-pixel circuit according embodiments described herein.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 2:
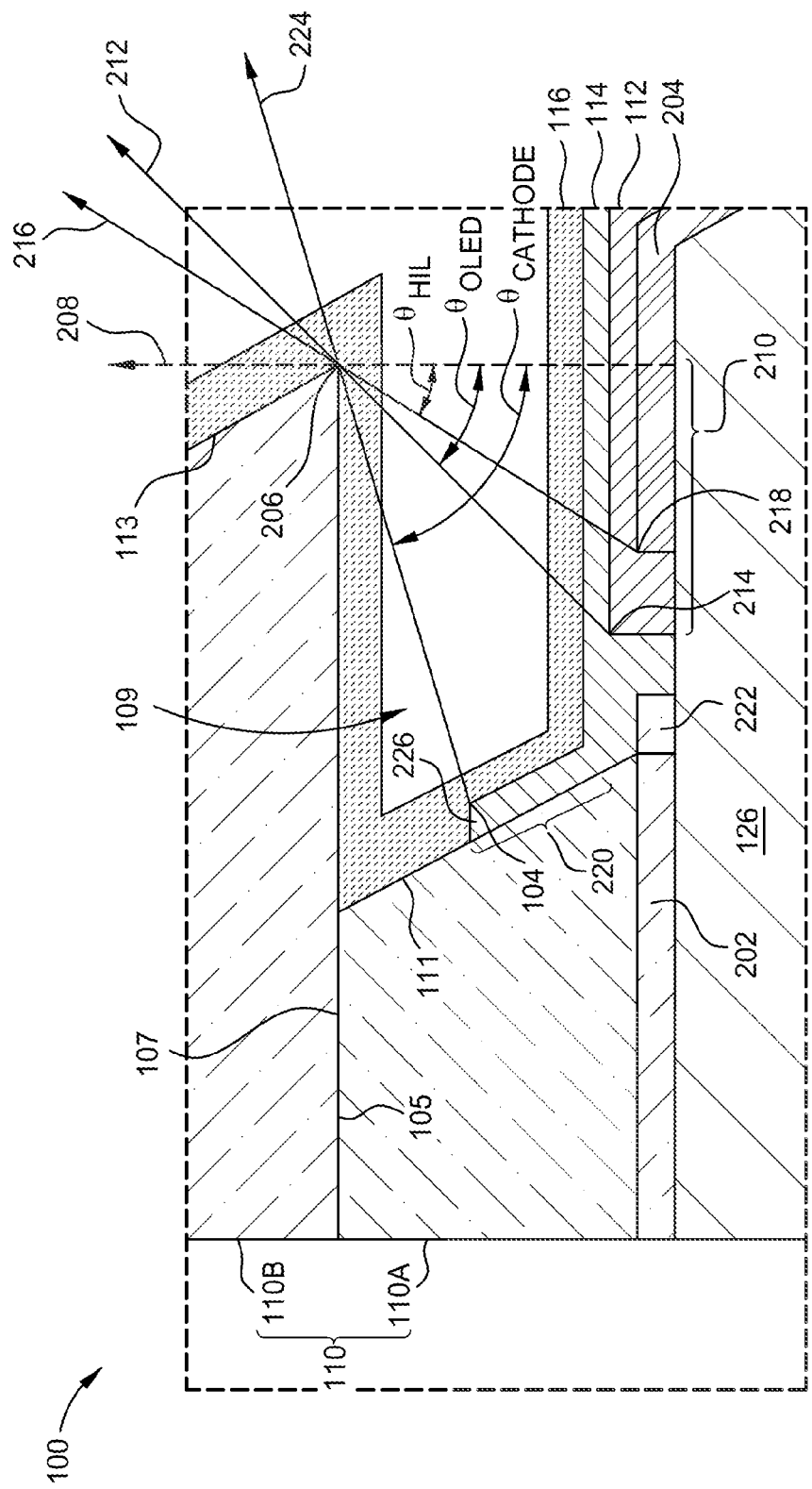
FIG. 2 is a schematic, cross-sectional view of an inorganic overhang structure of a sub-pixel circuit according to embodiments.

Embodiments described herein generally relate to a display. More specifically, embodiments described herein relate to sub-pixel circuits and methods of forming sub-pixel circuits that may be utilized in a display such as an organic light-emitting diode (OLED) display. In one embodiment, which can be combined with other embodiments described herein, the display is a bottom emission (BE) or a top emission (TE) OLED display. In another embodiment, which can be combined with other embodiments described herein, the display is a passive-matrix (PM) or an active matrix (AM) OLED display.

A first exemplary embodiment of the embodiments described herein includes a sub-pixel circuit having a dot-type architecture. A second exemplary embodiment of the embodiments described herein includes a sub-pixel circuit having a line-type architecture. A third exemplary embodiment of the embodiments described herein includes a sub-pixel circuit having a dot-type architecture with a plug disposed on an encapsulation layer of a respective sub-pixel. A fourth exemplary embodiment of the embodiments described herein includes a sub-pixel circuit having a line-type architecture with a plug disposed on an encapsulation layer of a respective sub-pixel. A fifth exemplary embodiment of the embodiments described herein includes an on-demand method to fabricate a sub-pixel circuit of one of the first, second, third, or fourth exemplary embodiments. A sixth exemplary embodiment of the embodiments described herein includes an on-demand half-tone lithography method to fabricate a sub-pixel circuit of one of the first and second exemplary embodiments. A seventh exemplary embodiment of the embodiments described herein includes a one-step method to fabricate a sub-pixel circuit of one of the first, second, third, or fourth exemplary embodiments.

Each of the embodiments (including the first-seventh exemplary embodiments) described herein of the sub-pixel circuit include a plurality of sub-pixels with each of the sub-pixels defined by adjacent inorganic overhang structures that are permanent to the sub-pixel circuit. While the Figures depict two sub-pixels with each sub-pixel defined by adjacent inorganic overhang structures, the sub-pixel circuit of the embodiments described herein include a plurality of sub-pixels, such as two or more sub-pixels. Each sub-pixel has the OLED material configured to emit a white, red, green, blue or other color light when energized. E.g., the OLED material of a first sub-pixel emits a red light when energized, the OLED material of a second sub-pixel emits a green light when energized, and the OLED material of a third sub-pixel emits a blue light when energized.

The inorganic overhang structures are permanent to the sub-pixel circuit and include at least an upper portion disposed on a lower portion. A first configuration of the inorganic overhang structures includes the upper portion of a non-conductive inorganic material and the lower portion of a conductive inorganic material. A second configuration of the inorganic overhang structures includes the upper portion of a conductive inorganic material and the lower portion of a conductive inorganic material. A third configuration of the inorganic overhang structures includes the upper portion of a non-conductive inorganic material, the lower portion of a non-conductive inorganic material, and an assistant cathode disposed under the lower portion. A fourth configuration of the inorganic overhang structures includes the upper portion of a conductive inorganic material, the lower portion of a non-conductive inorganic material, and an assistant cathode disposed under the lower portion. Any of the first, second, third, and fourth exemplary embodiments include inorganic overhang structures of at least one of the first, second, third, or fourth configurations.

The adjacent inorganic overhang structures defining each sub-pixel of the sub-pixel circuit of the display provide for formation of the sub-pixel circuit using evaporation deposition and provide for the inorganic overhang structures to remain in place after the sub-pixel circuit is formed (e.g., utilizing the methods of the fifth, sixth, or seventh exemplary embodiments). Evaporation deposition may be utilized for deposition of an OLED material (including a hole injection layer (HIL), a hole transport layer (HTL), an emissive layer (EML), and an electron transport layer (ETL)) and cathode. One or more of an encapsulation layer, the plug, and a global passivation layer may be disposed via evaporation deposition. In embodiments including one or more capping layers, the capping layers are disposed between the cathode and the encapsulation layer. The inorganic overhang structures define deposition angles, i.e., provide for a shadowing effect during evaporation deposition, for each of the OLED material and the cathode such the OLED material does not contact the lower portion (and assistant cathode according to embodiments with the third and fourth configurations) and the cathode contacts the lower portion according to the first and second configurations or at least the assistant cathode of the third and fourth configurations. The encapsulation layer of a respective sub-pixel is disposed over the cathode with the encapsulation layer extending under at least a portion of each of the adjacent inorganic overhang structures and along a sidewall of each of the adjacent inorganic overhang structures.

FIG. 1A is a schematic, cross-sectional view of a sub-pixel circuit 100 having a plugless arrangement 101A. The plugless arrangement 101A may correspond to the first or second exemplary embodiments of the sub-pixel circuit 100. FIG. 1B is a schematic, cross-sectional view of a sub-pixel circuit 100 having a plug arrangement 101B. The plug arrangement 101B may correspond to the third or fourth exemplary embodiments of the sub-pixel circuit 100. Each of the cross-sectional views of FIGS. 1A and 1B are taken along section line 1"-1" of FIGS. 1C and 1D.

The sub-pixel circuit 100 includes a substrate 102. Metal layers 104 may be patterned on the substrate 102 and are defined by adjacent pixel-defining layer (PDL) structures 126 disposed on the substrate 102. In one embodiment, which can be combined other embodiments described herein, the metal layers 104 are pre-patterned on the substrate 102. E.g., the substrate 102 is a pre-patterned indium tin oxide (ITO) glass substrate. The metal layers 104 are configured to operate anodes of respective sub-pixels. The metal layers 104 include, but are not limited to, chromium, titanium, gold, silver, copper, aluminum, ITO, a combination thereof, or other suitably conductive materials.

The PDL structures 126 are disposed on the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride ($Si_2N_2O$), magnesium fluoride ($MgF_2$), or combinations thereof. Adjacent PDL structures 126 define a respective sub-pixel and expose the anode (i.e., metal layer 104) of the respective sub-pixel of the sub-pixel circuit 100.

The sub-pixel circuit 100 has a plurality of sub-pixels 106 including at least a first sub-pixel 108a and a second sub-pixel 108b. While the Figures depict the first sub-pixel 108a and the second sub-pixel 108b. The sub-pixel circuit 100 of the embodiments described herein may include two or more sub-pixels 106, such as a third and a fourth sub-pixel. Each sub-pixel 106 has an OLED material 112 configured to emit a white, red, green, blue or other color light when energized. E.g., the OLED material 112 of the first sub-pixel 108a emits a red light when energized, the OLED material of the second sub-pixel 108b emits a green light when energized, the OLED material of a third sub-pixel emits a blue light when energized, and the OLED material of a fourth sub-pixel emits a other color light when energized Inorganic overhang structures 110 are disposed on an upper surface 103 of each of the PDL structures 126. The inorganic overhang structures 110 are permanent to the sub-pixel circuit. The inorganic overhang structures 110 further define each sub-pixel 106 of the sub-pixel circuit 100. The inorganic overhang structures 110 include at least an upper portion 110B disposed on a lower portion 110A. A first configuration of the inorganic overhang structures 110 includes the upper portion 110B of a non-conductive inorganic material and the lower portion 110A of a conductive inorganic material. A second configuration of the inorganic overhang structures 110 includes the upper portion 110B of a conductive inorganic material and the lower portion 110A of a conductive inorganic material. A third configuration of the inorganic overhang structures 110 includes the upper portion 110B of a non-conductive inorganic material, the lower portion 110A of a non-conductive inorganic material, and an assistant cathode 202 (shown in FIG. 2) disposed under the lower portion 110A. A fourth configuration of the inorganic overhang structures 110 includes the upper portion 110B of a conductive inorganic material, the lower portion 110A of a non-conductive inorganic material, and an assistant cathode 202 disposed under the lower portion 110A. The first, second, third, and fourth exemplary embodiments of the sub-pixel circuit 100 include inorganic overhang structures 110 of at least one of the first, second, third, or fourth configurations. The inorganic overhang structures 110 are able to remain in place, i.e., are permanent. Thus, organic material from lifted off overhang structures that disrupt OLED performance would not be left behind. Eliminating the need for a lift-off procedure also increases throughput.

The non-conductive inorganic material includes, but it not limited to, an inorganic silicon-containing material. E.g., the silicon-containing material includes oxides or nitrides of silicon, or combinations thereof. The conductive inorganic material includes, but it not limited to, a metal-containing material. E.g., the metal-containing material includes copper, titanium, aluminum, molybdenum, silver, indium tin oxide, indium zinc oxide, or combinations thereof.

At least a bottom surface 107 of the upper portion 110B is wider than a top surface 105 of the lower portion 110A to form an overhang 109. The bottom surface 107 larger than the top surface 105 forming the overhang 109 allows for the upper portion 110B to shadow the lower portion 110A. The shadowing of the overhang 109 provides for evaporation deposition each of the OLED material 112 and a cathode 114. As further discussed in the corresponding description of FIG. 2, the shadowing effect of the inorganic overhang structures 110 define a OLED angle $\theta_{OLED}$ (shown in FIG. 2) of the OLED material 112 and a cathode angle $\theta_{cathode}$ (shown in FIG. 2) of the cathode 114. The OLED angle $\theta_{OLED}$ of the OLED material 112 and the cathode angle $\theta_{cathode}$ of the cathode 114 may result from evaporation deposition of the OLED material 112 and the cathode 114. In the first and second configurations, the OLED material 112 does not contact and the cathode 114 contacts the lower portion 110A of the inorganic overhang structures 110. In the third and fourth configurations, the OLED material 112 does not contact the lower portion 110A and the assistant cathode 202, and the cathode 114 contacts at least the assistant cathode 202. In another configurations, the lower portion 110A is non-conductive and the assistant cathode 202 is not included. In this configuration the cathode 114 contacts busbars (not shown) outside of an active area of the sub-pixel circuit 100.

The OLED material 112 may include one or more of a HIL, a HTL, an EML, and an ETL. The OLED material 112 is disposed on the metal layer 104. In some embodiments, which can be combined with other embodiments described herein, the OLED material 112 is disposed on the metal layer 104 and over a portion of the PDL structures 126. The cathode 114 is disposed over the OLED material 112 of the PDL structures 126 in each sub-pixel 106. The cathode 114 may be disposed on a portion of a sidewall 111 of the lower portion 110A. The cathode 114 and the assistant cathode 202 include a conductive material, such as a metal. E.g., the cathode 114 and/or the assistant cathode 202 include, but are not limited to, chromium, titanium, aluminum, ITO, or a combination thereof. In some embodiments, which can be combined with other embodiments described herein, the OLED material 112 and the cathode 114 are disposed over a sidewall 113 of the upper portion 110B of the inorganic overhang structures 110. In other embodiments, which can be combined with other embodiments described herein, the OLED material 112 and the cathode 114 are disposed over a top surface 115 of the upper portion 110B of the inorganic overhang structures 110.

Each sub-pixel 106 includes include an encapsulation layer 116. The encapsulation layer 116 may be or may correspond to a local passivation layer. The encapsulation layer 116 of a respective sub-pixel is disposed over the cathode 114 (and OLED material 112) with the encapsulation layer 116 extending under at least a portion of each of the inorganic overhang structures 110 and along a sidewall of each of the inorganic overhang structures 110. The encapsulation layer 116 is disposed over the cathode 114 and over at least the sidewall 111 of the lower portion 110A. In some embodiments, which can be combined with other embodiments described herein, the encapsulation layer 116 is disposed over the sidewall 113 of the upper portion 110B. In some embodiments, which can be combined with other embodiments described herein, the encapsulation layer 116 is disposed over the top surface 115 of the upper portion 110B of the inorganic overhang structures 110. The encapsulation layer 116 includes the non-conductive inorganic material, such as the silicon-containing material. The silicon-containing material may include $Si_3N_4$ containing materials.

In embodiments including one or more capping layers, the capping layers are disposed between the cathode 114 and the encapsulation layer 116. E.g., as shown in FIG. 1A, a first capping layer 121 and a second capping layer 123 are disposed between the cathode 114 and the encapsulation layer 116. While FIG. 1A depicts the sub-pixel circuit 100 having one or more capping layers, each of the embodiments described herein may include one or more capping layers disposed between the cathode 114 and the encapsulation layer 116. The first capping layer 121 may include an organic material. The second capping layer 123 may include an inorganic material, such as lithium fluoride. The first capping layer 121 and the second capping layer 123 may be deposited by evaporation deposition.

The plugless arrangement 101A and the plug arrangement 101B of the sub-pixel circuit 100 further include at least a global passivation layer 120 disposed over the inorganic overhang structures 110 and the encapsulation layers 116. An inkjet layer 118 may be disposed between the global passivation layer 120 and the inorganic overhang structures 110 and the encapsulation layers 116. The inkjet layer 118 may include an acrylic material. The plug arrangement 101B (including the third and fourth exemplary embodiments) may include an intermediate passivation layer disposed over the inorganic overhang structures 110 and plugs 122 of each of the sub-pixels 106, and disposed between the inkjet layer 118 and the global passivation layer 120.

Figure 4D:
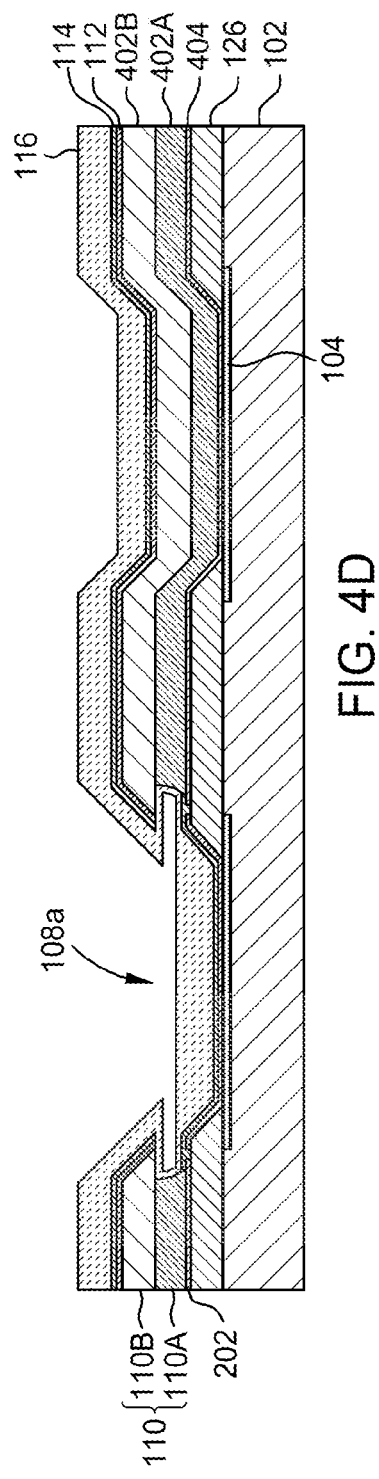
FIGS. 4A-4O are schematic, cross-sectional views of a substrate during a method for forming a sub-pixel circuit according embodiments.
FIGS. 4P-4W are schematic, cross-sectional views of a substrate during a method for forming a sub-pixel circuit according embodiments.

The plug arrangement 101B, including the third and fourth exemplary embodiments, includes plugs 122 disposed over the encapsulation layers 116. Each plug 122 is disposed in a respective sub-pixel 106 of the sub-pixel circuit 100. The plugs 122 may be disposed over the top surface 115 of the upper portion 110B of the inorganic overhang structures 110. The plugs 122 may have an additional passivation layer disposed thereon (as shown in FIG. 4Q). The plugs 122 include, but are not limited to, a photoresist, a color filter, or a photosensitive monomer. The plugs 122 have a plug transmittance that is matched or substantially matched to an OLED transmittance of the OLED material 112. The plugs 122 may each be the same material and match the OLED transmittance. The plugs 122 may be different materials that match the OLED transmittance of each respective sub-pixel of the plurality of sub-pixels 106. The matched or substantially matched resist transmittance and OLED transmittance allow for the plugs 122 to remain over the sub-pixels 106 without blocking the emitted light from the OLED material 112. The plugs 122 are able to remain in place and thus do not require a lift off procedure to be removed from the sub-pixel circuit 100. Additional pattern resist materials disposed over the formed sub-pixels 106 at subsequent operations are not required because the plugs 122 remain. Eliminating the need for a lift-off procedure on the plugs 122 and the need for additional pattern resist materials on the sub-pixel circuit 100 increases throughput.

FIG. 1C is a schematic, top sectional view of a sub-pixel circuit 100 having a dot-type architecture 101C. The dot-type architecture 101C may correspond to the first or third exemplary embodiments of the sub-pixel circuit 100. FIG. 1D is a schematic, cross-sectional view of a sub-pixel circuit 100 having a line-type architecture 101D. The line-type architecture 101D may correspond to the second or fourth exemplary embodiments of the sub-pixel circuit 100. Each of the top sectional views of FIGS. 1C and 1D are taken along section line 1'-1' of FIGS. 1A and 1B.

The dot-type architecture 101C includes a plurality of pixel openings 124A. Each of pixel opening 124A is surrounded by inorganic overhang structures 110 that define each of the sub-pixels 106 of the dot-type architecture 101C. The line-type architecture 101D includes a plurality of pixel openings 124B. Each of pixel opening 124B is abutted by inorganic overhang structures 110 that define each of the sub-pixels 106 of the line-type architecture 101D. Each of an on-demand method 300, an on-demand half-tone lithography method 500, and an one-step method 600 of fabricating a sub-pixel circuit 100 described herein provide for the ability to fabricate both the sub-pixel circuit 100 with the dot-type architecture 101C and the sub-pixel circuit 100 with the line-type architecture 101D.

FIG. 2 is a schematic, cross-sectional view of an inorganic overhang structure 110 of a sub-pixel circuit 100. While FIG. 2 depicts the third and fourth configurations of the inorganic overhang structures 110, the description herein is applicable to the first configuration of the inorganic overhang structures 110 including the upper portion 110B of a non-conductive inorganic material and the lower portion 110A of a conductive inorganic material, and the second configuration of the inorganic overhang structures 110 including the upper portion 110B of a conductive inorganic material and the lower portion 110A of a conductive inorganic material. In the first and second configurations, the OLED material 112 does not contact and the cathode 114 contacts the lower portion 110A of the inorganic overhang structures 110. In the third and fourth configurations, the OLED material 112 does not contact the lower portion 110A and the assistant cathode 202, and the cathode 114 contacts at least the assistant cathode 202.

The upper portion 110B includes an underside edge 206 and an overhang vector 208. The underside edge 206 extends past the sidewall 111 of the lower portion 110A. The overhang vector 208 is defined by the underside edge 206 and the PDL structure 126. The OLED material 112 is disposed over the anode and over a shadow portion 210 of the PDL structure 126. The OLED material 112 forms an OLED angle $\theta_{OLED}$ between an OLED vector 212 and the overhang vector 208. The OLED vector 212 is defined by an OLED edge 214 extending under the upper portion 110B and the underside edge 206 of the upper portion 110B. In one embodiment, which can be combined with other embodiments described herein, a HIL 204 of the OLED material 112 included. In the embodiment including the HIL 204, the OLED material 112 includes the HTL, the EML, and the ETL. The HIL 204 forms an HIL angle $\theta_{HIL}$ between a HIL vector 216 and the overhang vector 208. The HIL vector 216 is defined by an HIL edge 218 extending under the upper portion 110B and the underside edge 206 of the upper portion 110B.

The cathode 114 is disposed over the OLED material 112 and over the shadow portion 210 of the PDL structure 126. In some embodiments, which can be combined with other embodiments described herein, the cathode 114 is disposed on a portion 220 of the sidewall 111 of the lower portion 110A. In other embodiments, which can be combined with other embodiments described herein, the cathode 114 contacts a portion 222 of the assistant cathode 202 on the shadow portion 210 of the PDL 126. In the embodiments with the cathode 114 contacting the portion 222 of the assistant cathode 202, the cathode 114 may also contact the portion 220 of the sidewall 111 of the lower portion 110A. The cathode 114 forms a cathode angle $\theta_{cathode}$ between a cathode vector 224 and the overhang vector 208. The cathode vector 224 is defined by a cathode edge 226 at least extending under the upper portion 110B and the underside edge 206 of the upper portion 110B. The encapsulation layer 116 is disposed over the cathode 114 (and OLED material 112) with the encapsulation layer 116 extending at least under the upper portion 110B of the inorganic overhang structure 110 and along the sidewall 111 of the lower portion 110A.

During evaporation deposition of the OLED material 112, the underside edge 206 of the upper portion 110B defines the position of the OLED edge 214. E.g., the OLED material 112 is evaporated at an OLED maximum angle that corresponds to the OLED vector 212 and the underside edge 206 ensures that the OLED material 112 is not deposited past the OLED edge 214. In embodiments with the HIL 204, the underside edge 206 of the upper portion 110B defines the position of the HIL edge 218. E.g., the HIL 204 is evaporated at an HIL maximum angle that corresponds to the HIL vector 216 and the underside edge 206 ensures that HIL 204 is not deposited past the HIL edge 218. During evaporation deposition of the cathode 114, the underside edge 206 of the upper portion 110B defines the position of the cathode edge 226. E.g., the cathode 114 is evaporated at a cathode maximum angle that corresponds to the cathode vector 224 and the underside edge 206 ensures that the cathode 114 is not deposited past the cathode edge 226. The OLED angle $\theta_{OLED}$ is less than the cathode angle $\theta_{cathode}$. The HIL angle $\theta_{HIL}$ is less than the OLED angle $\theta_{OLED}$.

Figure 3:
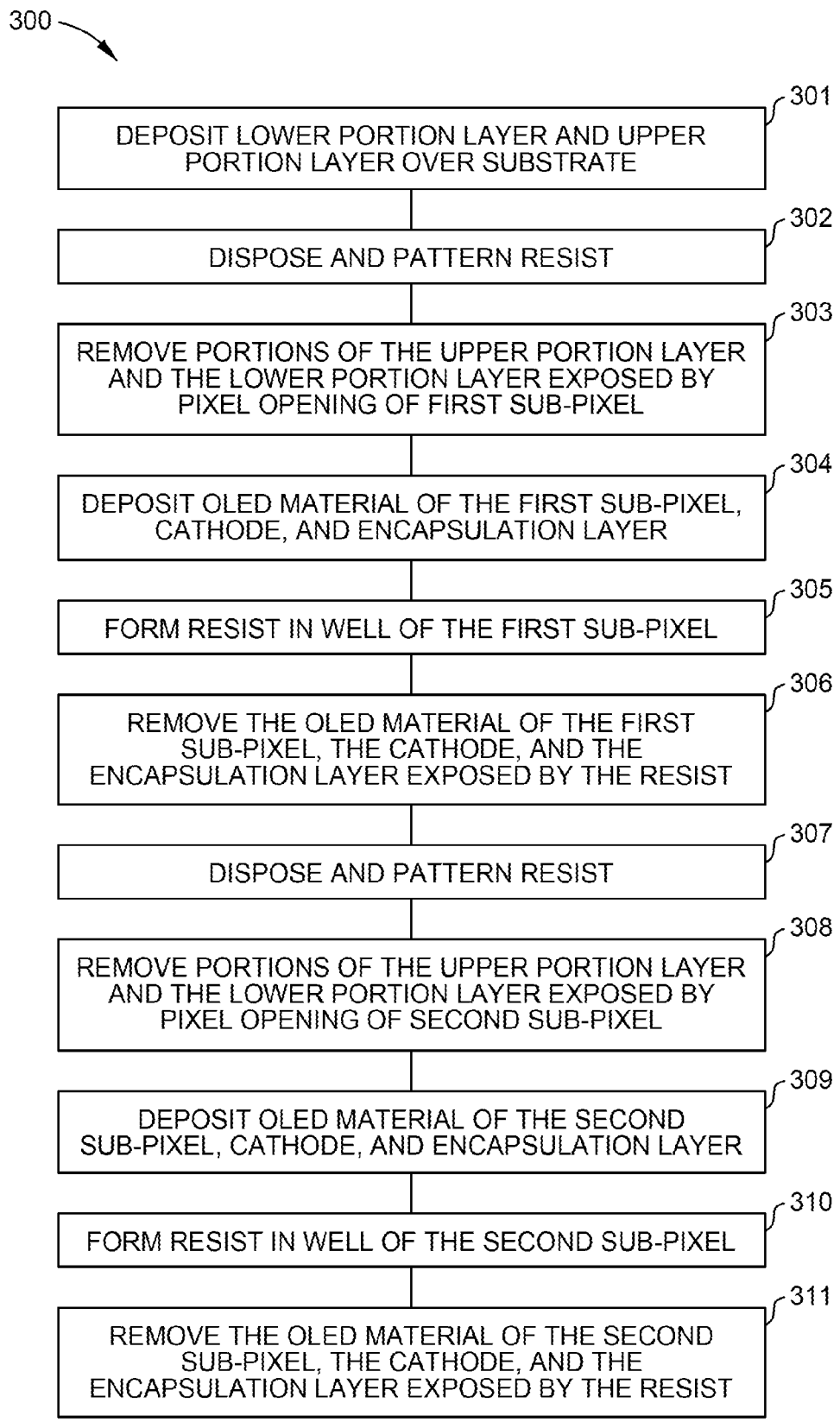
FIG. 3 is a flow a flow diagram of an on-demand method for forming a sub-pixel circuit according to embodiments.

FIG. 3 is a flow a flow diagram of an on-demand method 300 for forming a sub-pixel circuit 100. The on-demand method 300 corresponds to the on-demand method to fabricate a sub-pixel circuit 100 of one of the first, second, third, or fourth exemplary embodiments. FIGS. 4A-4O are schematic, cross-sectional views of a substrate 102 during the method 300 for forming the sub-pixel circuit 100 according embodiments described herein. FIGS. 4A-4F, 4H, 4J, 4L, and 4N correspond to the plugless arrangement 101A of the first or second exemplary embodiments of the sub-pixel circuit 100. FIGS. 4A-4E, 4G, 4I, 4K, 4M, and 4O correspond to the plug arrangement 101B of the third or fourth exemplary embodiments of the sub-pixel circuit 100.

At operation 301, as shown in FIG. 4A, a lower portion layer 402A and an upper portion layer 402B are deposited over the substrate 102. The lower portion layer 402A is disposed over the PDL structures 126 and the metal layers 104. The upper portion layer 402B is disposed over the lower portion layer 402A. The lower portion layer 402A corresponds to the lower portion 110A and the upper portion layer 402B corresponds to the upper portion 110B of the inorganic overhang structures 110. In embodiments including the third and fourth configurations of the inorganic overhang structures 110, an assistant cathode layer 404 is disposed between the lower portion layer 402A and the PDL structures 126 and the metal layers 104.

At operation 302, as shown in FIG. 4B, a resist 406 is disposed and patterned. The resist 406 is disposed over the upper portion layer 402B. The resist 406 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist 406 determines whether the resist is a positive resist or a negative resist. The resist 406 is patterned to form one of a pixel opening 124A of the dot-type architecture 101C or a pixel opening 124B of the line-type architecture 101D of a first sub-pixel 108a. The patterning is one of a photolithography, digital lithography process, or laser ablation process.

At operation 303, as shown in FIG. 4C, portions of the upper portion layer 402B and the lower portion layer 402A exposed by the pixel opening 124A, 124B are removed. The upper portion layer 402B exposed by the pixel opening 124A, 124B may be removed a dry etch process. The lower portion layer 402A exposed by the pixel opening 124A, 124B may be removed by a wet etch process. In embodiments including the assistant cathode layer 404, a portion of the assistant cathode layer 404 may be removed by a dry etch process or a wet etch process to form the assistant cathode 202 disposed under the lower portion 110A. Operation 303 forms the inorganic overhang structures 110 of the first sub-pixel 108a. The etch selectivity of the between the materials of the upper portion layer 402B corresponding to the upper portion 110B and the lower portion layer 402A corresponding to the lower portion 110A and the etch processes to remove the exposed portions of the upper portion layer 402B and the lower portion layer 402A provide for the bottom surface 107 of the upper portion 110B being wider than the top surface 105 of the lower portion 110A to form the overhang 109 (as shown in FIGS. 1A, 1B, and 2). The shadowing of the overhang 109 provides for evaporation deposition the OLED material 112 and the cathode 114.

At operation 304, as shown in FIG. 4D, the OLED material 112 of the first sub-pixel 108a, the cathode 114, and the encapsulation layer 116 are deposited. The shadowing of the overhang 109 provides for evaporation deposition each of the OLED material 112 and a cathode 114. As further discussed in the corresponding description of FIG. 2, the shadowing effect of the inorganic overhang structures 110 define the OLED angle $\theta_{OLED}$ (shown in FIG. 2) of the OLED material 112 and the cathode angle $\theta_{cathode}$ (shown in FIG. 2) of the cathode 114. The OLED angle $\theta_{OLED}$ of the OLED material 112 and the cathode angle $\theta_{cathode}$ of the cathode 114 result from evaporation deposition of the OLED material 112 and the cathode 114. In the first and second configurations, the OLED material 112 does not contact and the cathode 114 contacts the lower portion 110A of the inorganic overhang structures 110. In the third and fourth configurations, the OLED material 112 does not contact the lower portion 110A and the assistant cathode 202, and the cathode 114 contacts at least the assistant cathode 202. The encapsulation layer 116 is deposited over the cathode 114. In embodiments including capping layers, the capping layers are deposited between the cathode 114 and the encapsulation layer 116. The capping layers may be deposited by evaporation deposition.

Figure 4E:
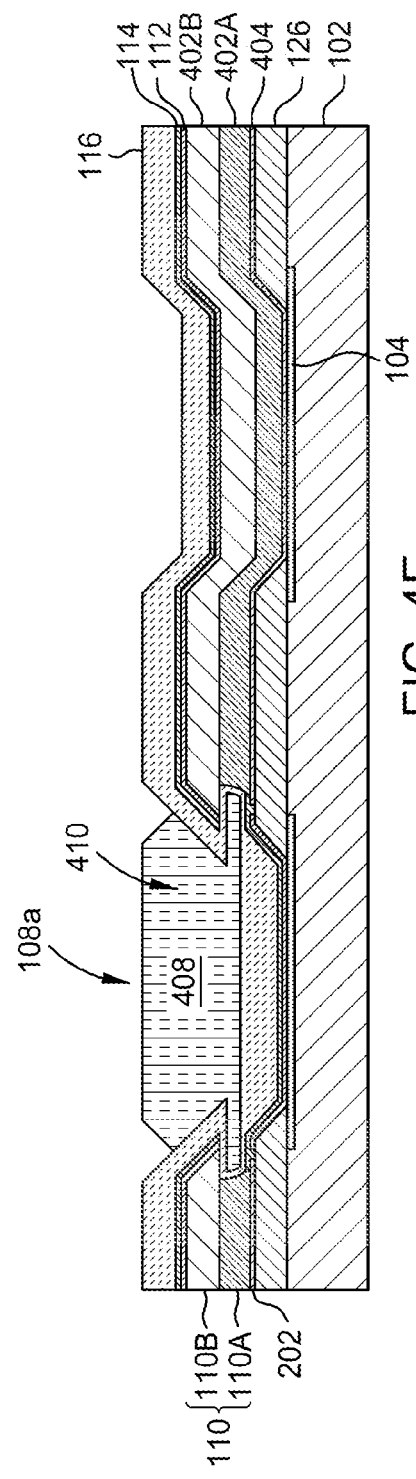

At operation 305, as shown in FIG. 4E, a resist 408 is formed in a well 410 of the first sub-pixel 108a. At operation 306, as shown in FIGS. 4F and 4G, the encapsulation layer 116, the cathode 114, and the OLED material 112 exposed by the resist 408 are removed. The encapsulation layer 116, the cathode 114, and the OLED material 112 exposed by resist 408 may be removed by wet etch processes. According to embodiments with the plugless arrangement 101A of the sub-pixel circuit 100, the resist 408 is removed, as shown in FIG. 4F. According to embodiments with the plug arrangement 101B of the sub-pixel circuit 100, the resist 408 is corresponds to the plug 122 of the first sub-pixel 108a, as shown in FIG. 4G. At operation 307, as shown in FIGS. 4H and 4I, a resist 412 is disposed and patterned. The resist 412 is disposed over the upper portion layer 402B and the upper portion 110B of the first sub-pixel 108a. In embodiments with the plug arrangement 101B, as shown in FIG. 4I, a passivation layer 414 is disposed at least the plug 122 of the first sub-pixel 108a. The passivation layer 414 of the plug arrangement 101B may be disposed over the upper portion layer 402B and the upper portion 110B of the first sub-pixel 108a. The resist 412 is patterned to form one of the pixel opening 124A of the dot-type architecture 101C or the pixel opening 124B of the line-type architecture 101D of a second sub-pixel 108b.

At operation 308, portions of the upper portion layer 402B and the lower portion layer 402A exposed by the pixel opening 124A, 124B of the second sub-pixel 108b are removed. The upper portion layer 402B exposed by the pixel opening 124A, 124B may be removed a dry etch process. The lower portion layer 402A exposed by the pixel opening 124A, 124B may be removed by a wet etch process. In embodiments including the assistant cathode layer 404, a portion of the assistant cathode layer 404 may be removed by a dry etch process or a wet etch process to form the assistant cathode 202 disposed under the lower portion 110A. Operation 308 forms the inorganic overhang structures 110 of the second sub-pixel 108b. The etch selectivity of the between the materials of the upper portion layer 402B corresponding to the upper portion 110B and the lower portion layer 402A corresponding to the lower portion 110A and the etch processes to remove the exposed portions of the upper portion layer 402B and the lower portion layer 402A provide for the bottom surface 107 of the upper portion 110B being wider than the top surface 105 of the lower portion 110A to form the overhang 109 (as shown in FIGS. 1A, 1B, and 2). The shadowing of the overhang 109 provides for evaporation deposition the OLED material 112 and the cathode 114.

Figure 4J:
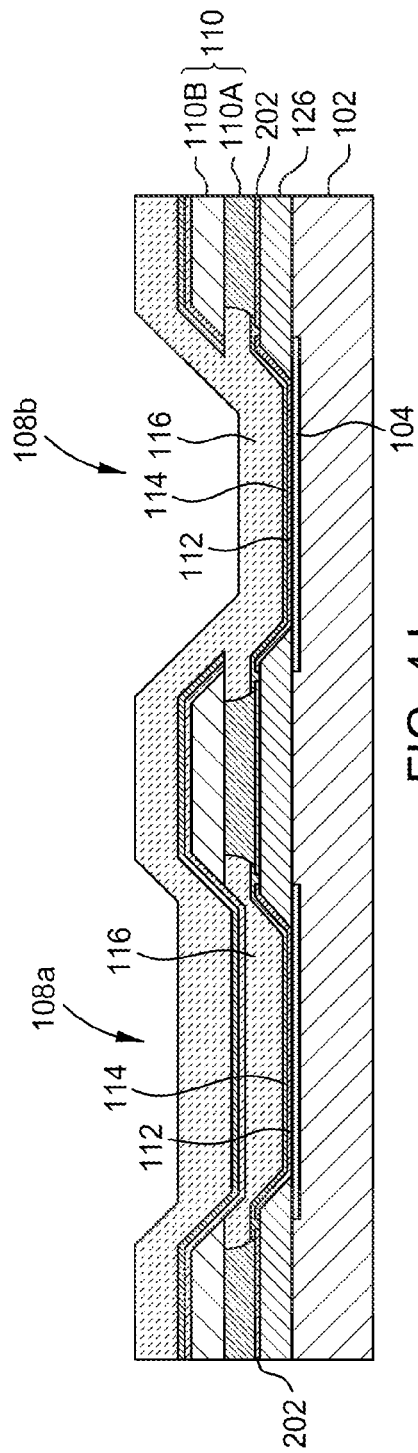
Figure 4K:
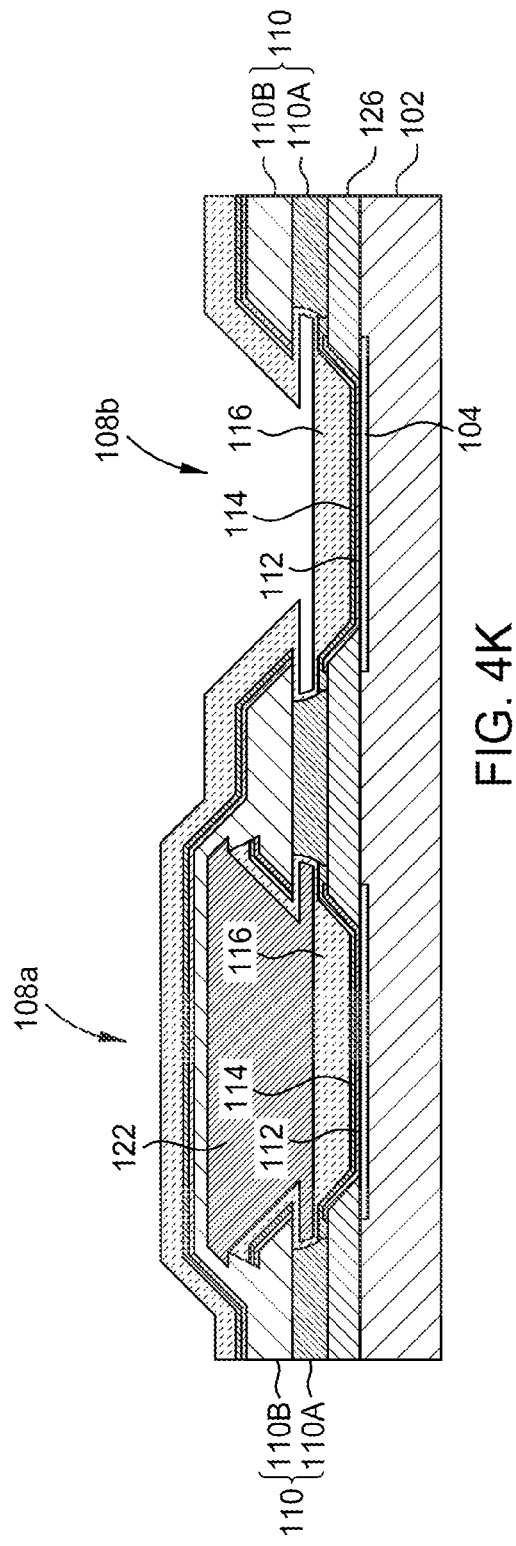

At operation 309, as shown in FIGS. 4J and 4K, the OLED material 112 of the second sub-pixel 108b, the cathode 114, and the encapsulation layer 116 are deposited. In embodiments including capping layers, the capping layers are deposited between the cathode 114 and the encapsulation layer 116. The capping layers may be deposited by evaporation deposition. The shadowing of the overhang 109 provides for evaporation deposition each of the OLED material 112 and a cathode 114. As further discussed in the corresponding description of FIG. 2, the shadowing effect of the inorganic overhang structures 110 define the OLED angle $\theta_{OLED}$ (shown in FIG. 2) of the OLED material 112 and the cathode angle $\theta_{cathode}$ (shown in FIG. 2) of the cathode 114. The OLED angle $\theta_{OLED}$ of the OLED material 112 and the cathode angle $\theta_{cathode}$ of the cathode 114 result from evaporation deposition of the OLED material 112 and the cathode 114. In the first and second configurations, the OLED material 112 does not contact and the cathode 114 contacts the lower portion 110A of the inorganic overhang structures 110. In the third and fourth configurations, the OLED material 112 does not contact the lower portion 110A and the assistant cathode 202, and the cathode 114 contacts at least the assistant cathode 202. The encapsulation layer 116 is deposited over the cathode 114.

Figure 4N:
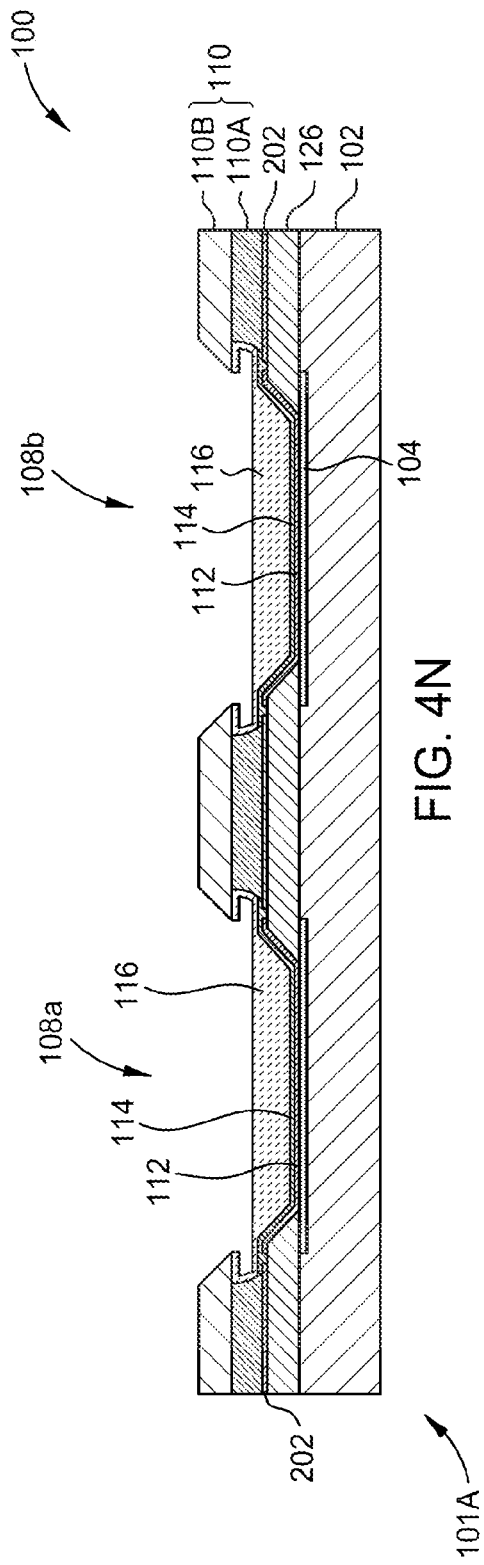
Figure 4O:
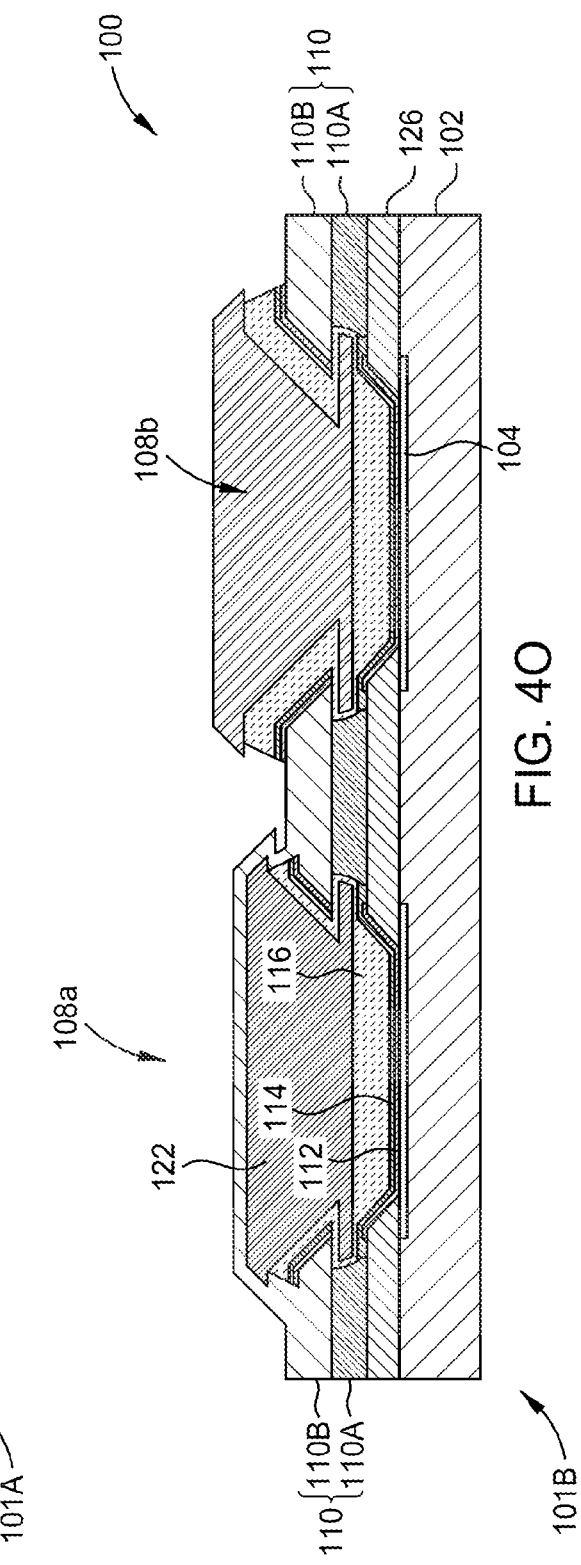

At operation 310, as shown in FIGS. 4L and 4M, a resist 416 is formed in a well 418 of the second sub-pixel 108b. At operation 311, as shown in FIGS. 4N and 4O, the encapsulation layer 116, the cathode 114, and the OLED material 112 exposed by the resist 416 are removed. The encapsulation layer 116, the cathode 114, and the OLED material 112 exposed by resist 416 may be removed by wet etch processes. According to embodiments with the plugless arrangement 101A of the sub-pixel circuit 100, the resist 416 is removed, as shown in FIG. 4F. According to embodiments with the plug arrangement 101B of the sub-pixel circuit 100, the resist 416 is corresponds to the plug 122 of the second sub-pixel 108b, as shown in FIGS. 4G and 4O. Operations 301-311 described herein form the sub-pixel circuit 100 including two sub-pixels 106. Operations 306-310 may be repeated for each addition sub-pixel, e.g. for a third and/or a fourth sub-pixel.

Figure 4P:
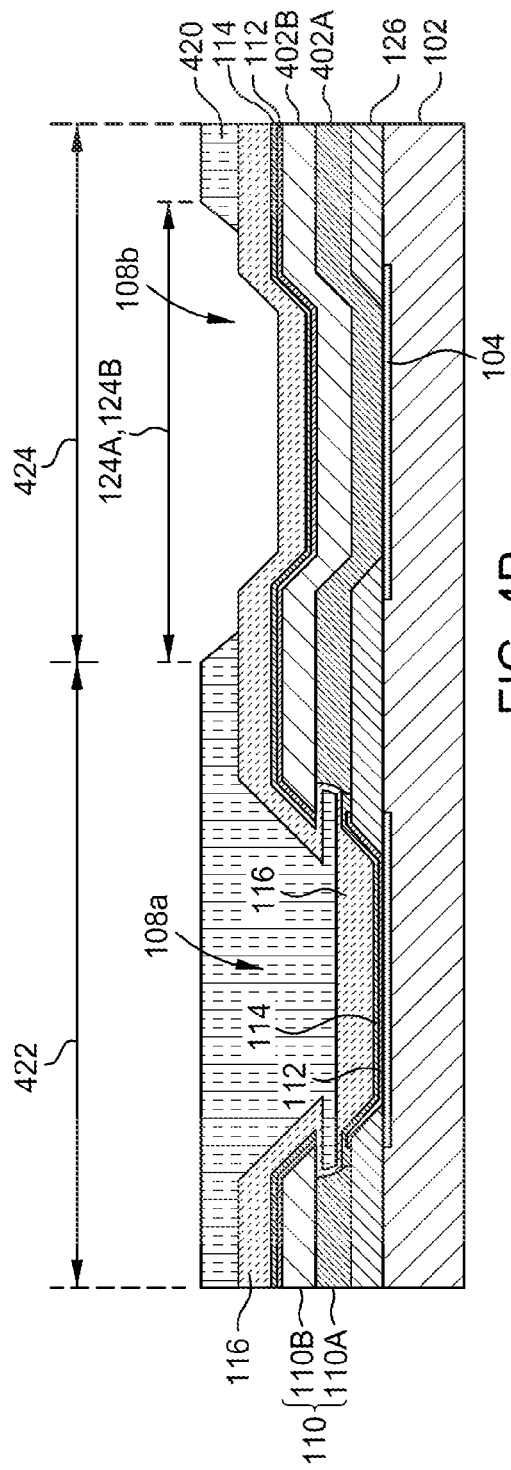
Figure 4Q:
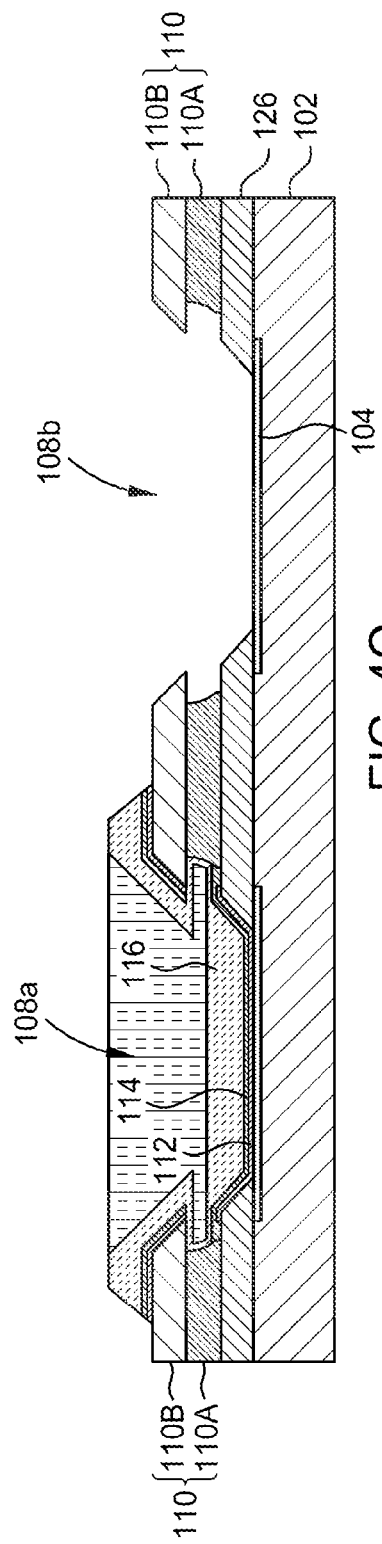
Figure 4V:
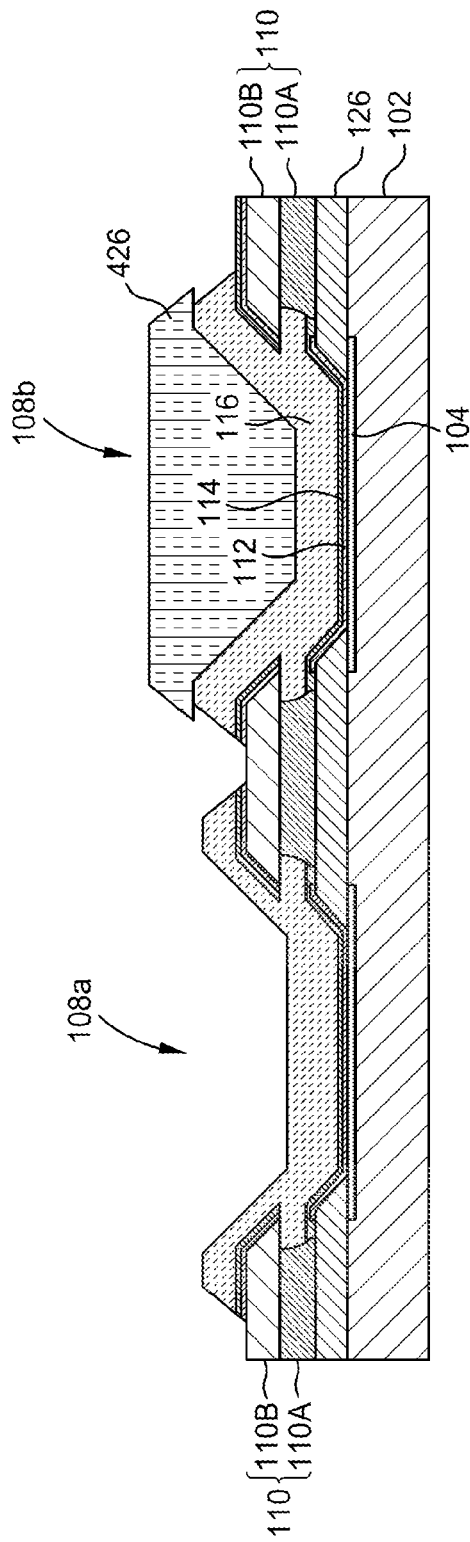
Figure 4W:
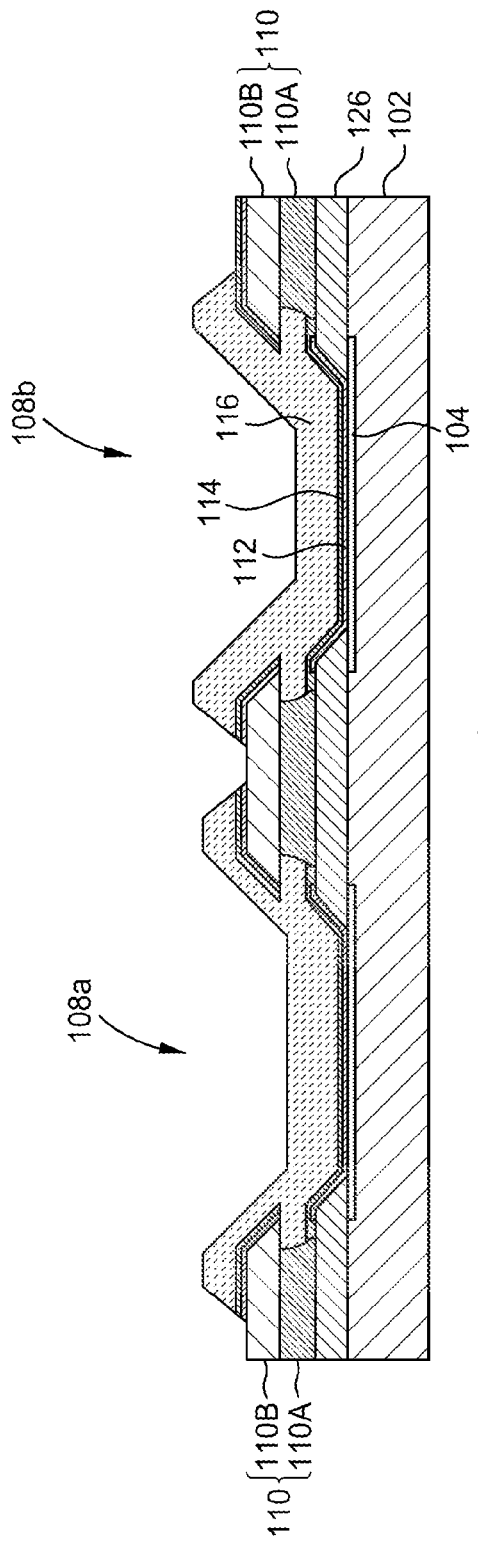
Figure 5:
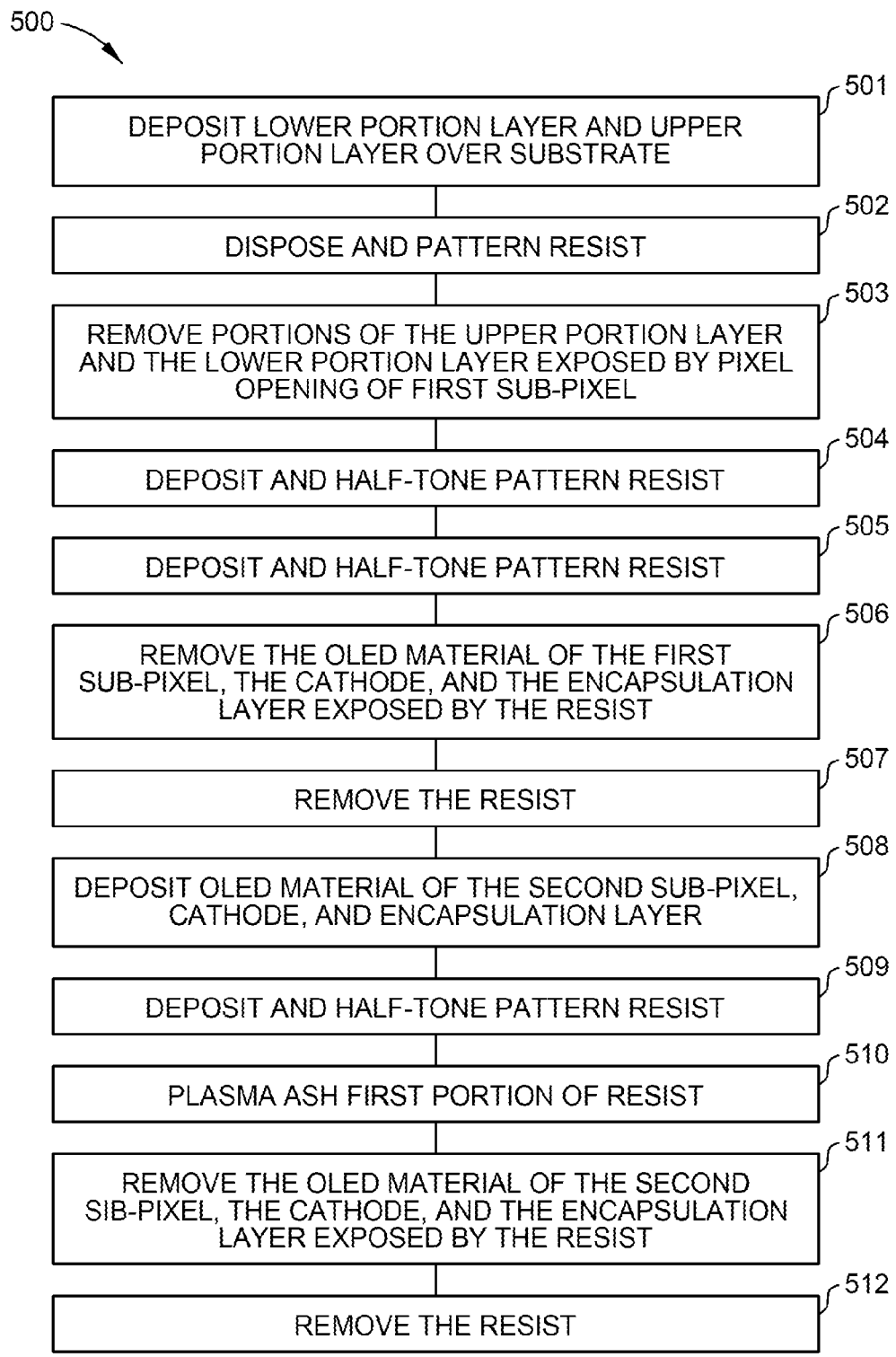
FIG. 5 is a flow a flow diagram of an on-demand half-tone lithography method for forming a sub-pixel circuit according to embodiments.

FIG. 5 is a flow a flow diagram of an on-demand half-tone lithography method 500 for forming a sub-pixel circuit 100. The on-demand half-tone lithography method 500 corresponds to the on-demand half-tone lithography method to fabricate a sub-pixel circuit 100 of one of the first and second exemplary embodiments. FIGS. 4A-4D and 4P-4W are schematic, cross-sectional views of a substrate 102 during the method 500 for forming the sub-pixel circuit 100 according embodiments described herein.

At operation 501, as shown in FIG. 4A, a lower portion layer 402A and an upper portion layer 402B are deposited over the substrate 102. The lower portion layer 402A is disposed over the PDL structures 126 and the metal layers 104. The upper portion layer 402B is disposed over the lower portion layer 402A. The lower portion layer 402A corresponds to the lower portion 110A and the upper portion layer 402B corresponds to the upper portion 110B of the inorganic overhang structures 110. In embodiments including the third and fourth configurations of the inorganic overhang structures 110, an assistant cathode layer 404 is disposed between the lower portion layer 402A and the PDL structures 126 and the metal layers 104.

At operation 502, as shown in FIG. 4B, a resist 406 is disposed and patterned. The resist 406 is disposed over the upper portion layer 402B. The resist 406 is a positive resist or a negative resist. A positive resist includes portions of the resist, which, when exposed to electromagnetic radiation, are respectively soluble to a resist developer applied to the resist after the pattern is written into the resist using the electromagnetic radiation. A negative resist includes portions of the resist, which, when exposed to radiation, will be respectively insoluble to the resist developer applied to the resist after the pattern is written into the resist using the electromagnetic radiation. The chemical composition of the resist 406 determines whether the resist is a positive resist or a negative resist. The resist 406 is patterned to form one of a pixel opening 124A of the dot-type architecture 101C or a pixel opening 124B of the line-type architecture 101D of a first sub-pixel 108a. The patterning is one of a photolithography, digital lithography process, or laser ablation process.

At operation 503, as shown in FIG. 4C, portions of the upper portion layer 402B and the lower portion layer 402A exposed by the pixel opening 124A, 124B are removed. The upper portion layer 402B exposed by the pixel opening 124A, 124B may be removed a dry etch process. The lower portion layer 402A exposed by the pixel opening 124A, 124B may be removed by a wet etch process. In embodiments including the assistant cathode layer 404, a portion of the assistant cathode layer 404 may be removed by a dry etch process or a wet etch process to form the assistant cathode 202 disposed under the lower portion 110A. Operation 503 forms the inorganic overhang structures 110 of the first sub-pixel 108a. The etch selectivity of the between the materials of the upper portion layer 402B corresponding to the upper portion 110B and the lower portion layer 402A corresponding to the lower portion 110A and the etch processes to remove the exposed portions of the upper portion layer 402B and the lower portion layer 402A provide for the bottom surface 107 of the upper portion 110B being wider than the top surface 105 of the lower portion 110A to form the overhang 109 (as shown in FIGS. 1A, 1B, and 2). The shadowing of the overhang 109 provides for evaporation deposition the OLED material 112 and the cathode 114.

At operation 504, as shown in FIG. 4D, the OLED material 112 of the first sub-pixel 108a, the cathode 114, and the encapsulation layer 116 are deposited. In embodiments including capping layers, the capping layers are deposited between the cathode 114 and the encapsulation layer 116. The capping layers may be deposited by evaporation deposition. The shadowing of the overhang 109 provides for evaporation deposition each of the OLED material 112 and a cathode 114. As further discussed in the corresponding description of FIG. 2, the shadowing effect of the inorganic overhang structures 110 define the OLED angle $\theta_{OLED}$ (shown in FIG. 2) of the OLED material 112 and the cathode angle $\theta_{cathode}$ (shown in FIG. 2) of the cathode 114. The OLED angle $\theta_{OLED}$ of the OLED material 112 and the cathode angle $\theta_{cathode}$ of the cathode 114 result from evaporation deposition of the OLED material 112 and the cathode 114. In the first and second configurations, the OLED material 112 does not contact and the cathode 114 contacts the lower portion 110A of the inorganic overhang structures 110. In the third and fourth configurations, the OLED material 112 does not contact the lower portion 110A and the assistant cathode 202, and the cathode 114 contacts at least the assistant cathode 202. The encapsulation layer 116 is deposited over the cathode 114.

At operation 505, as shown in FIG. 4P, a resist 420 is deposed and half-tone patterned. Half-tone patterning the resist 420 includes a digital lithography process that patterns the resist to form two or more portions with each of the portions having different depths. Each portion corresponds to a respective sub-pixel. As shown in FIG. 4P, the half-tone patterning of the resist 420 forms a first portion 422 over the first sub-pixel 108a and a second portion 424 over the second sub-pixel 108b to be formed. The second portion 424 exposes portions of the pixel opening 124A, 124B of the second sub-pixel 108b. At operation 506, as shown in FIG. 4Q, the encapsulation layer 116, the cathode 114, the OLED material 112, the upper portion layer 402B, and the lower portion layer 402A exposed by the pixel opening 124A, 124B are removed. Operation 506 forms the inorganic overhang structures 110 of the second sub-pixel 108b. The etch selectivity of the between the materials of the upper portion layer 402B corresponding to the upper portion 110B and the lower portion layer 402A corresponding to the lower portion 110A and the etch processes to remove the exposed portions of the upper portion layer 402B and the lower portion layer 402A provide for the bottom surface 107 of the upper portion 110B being wider than the top surface 105 of the lower portion 110A to form the overhang 109 (as shown in FIGS. 1A, 1B, and 2). The shadowing of the overhang 109 provides for evaporation deposition the OLED material 112 and the cathode 114.

At operation 507, as shown in FIG. 4R, the resist 420 is removed. At operation 508, as shown in FIG. 4S, the OLED material 112 of the second sub-pixel 108b, the cathode 114, and the encapsulation layer 116 are deposited. In embodiments including capping layers, the capping layers are deposited between the cathode 114 and the encapsulation layer 116. The capping layers may be deposited by evaporation deposition. The shadowing of the overhang 109 provides for evaporation deposition each of the OLED material 112 and a cathode 114. As further discussed in the corresponding description of FIG. 2, the shadowing effect of the inorganic overhang structures 110 define the OLED angle $\theta_{OLED}$ (shown in FIG. 2) of the OLED material 112 and the cathode angle $\theta_{cathode}$ (shown in FIG. 2) of the cathode 114. The OLED angle $\theta_{OLED}$ of the OLED material 112 and the cathode angle $\theta_{cathode}$ of the cathode 114 result from evaporation deposition of the OLED material 112 and the cathode 114. In the first and second configurations, the OLED material 112 does not contact and the cathode 114 contacts the lower portion 110A of the inorganic overhang structures 110. In the third and fourth configurations, the OLED material 112 does not contact the lower portion 110A and the assistant cathode 202, and the cathode 114 contacts at least the assistant cathode 202. The encapsulation layer 116 is deposited over the cathode 114.

At operation 509, as shown in FIG. 4T, a resist 426 is deposed and half-tone patterned. Half-tone patterning the resist 426 includes a digital lithography process that patterns the resist to form two or more portions with each of the portions having different depths. Each portion corresponds to a respective sub-pixel. As shown in FIG. 4U, the half-tone patterning of the resist 426 forms a first portion 422 over the first sub-pixel 108a and a second portion 424 over the second sub-pixel 108b. At operation 510, as shown in FIG. 4V, the first portion 422 of the resist 426 is plasma ashed. At operation 511, as shown in FIG. 4W, the encapsulation layer 116, the cathode 114, and the OLED material 112 of the second sub-pixel 108b exposed by the resist 426 are removed. At operation 512, as shown in FIG. 4Y, the resist 426 is removed. Operations 501-512 described herein form the sub-pixel circuit 100 including two sub-pixels 106. Operations 505-512 may be repeated for each addition sub-pixel, e.g. for a third and/or a fourth sub-pixel.

Figure 6:
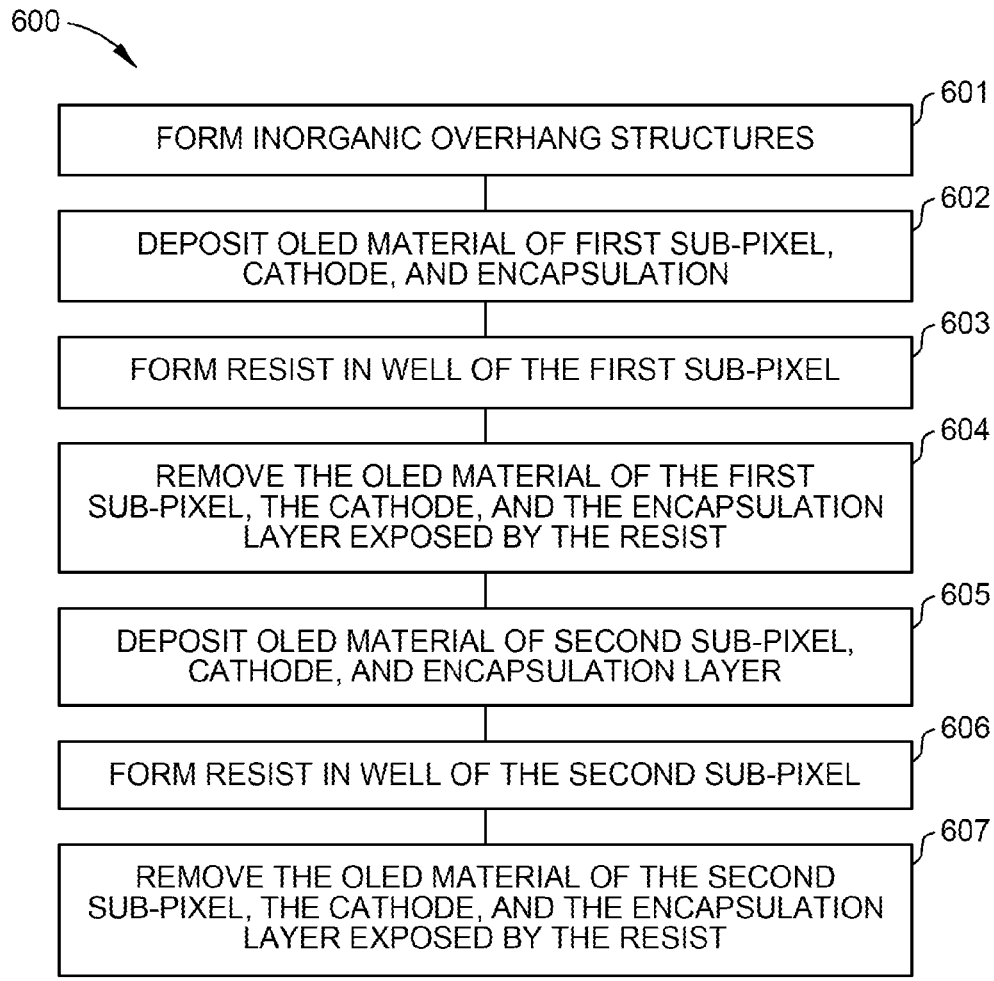
FIG. 6 is a flow a flow diagram of a one-step method for forming a sub-pixel circuit according to embodiments.

FIG. 6 is a flow a flow diagram of a one-step method 600 for forming a sub-pixel circuit 100. The one-step method 600 corresponds to the one-step method to fabricate a sub-pixel circuit 100 of one of the first, second, third, or fourth exemplary embodiments. FIGS. 7A-7L are schematic, cross-sectional views of a substrate 102 during the method 600 for forming the sub-pixel circuit 100 according embodiments described herein. FIGS. 7A-7C, 7E, 7G, 7I, and 7K correspond to the plugless arrangement 101A of the first or second exemplary embodiments of the sub-pixel circuit 100. FIGS. 7A, 7B, 7D, 7F, 7H, 7J, and 7L correspond to the plug arrangement 101B of the third or fourth exemplary embodiments of the sub-pixel circuit 100.

At operation 601, as shown in FIG. 7A, the inorganic overhang structures 110 are formed. Forming the inorganic overhang structures 110 includes a lower portion layer and an upper portion layer are deposited over the substrate 102. The first lower portion is disposed over the PDL structures 126 and the metal layers 104. The upper portion layer is disposed over the lower portion layer. The lower portion layer corresponds to the lower portion 110A and the upper portion layer corresponds to the upper portion 110B of the inorganic overhang structures 110. In embodiments including the third and fourth configurations of the inorganic overhang structures 110, an assistant cathode layer is disposed between the lower portion layer 402A and the PDL structures 126 and the metal layers 104. The assistant cathode layer corresponds to the assistant cathode 202. A resist is disposed and patterning over the upper portion layer. To form the inorganic overhang structures 110 portions of the upper portion layer 402B and the lower portion layer 402A exposed by the pixel opening 124A, 124B are removed.

At operation 602, as shown in FIG. 7B, the OLED material 112 of the first sub-pixel 108a, the cathode 114, and the encapsulation layer 116 are deposited. In embodiments including capping layers, the capping layers are deposited between the cathode 114 and the encapsulation layer 116. The capping layers may be deposited by evaporation deposition. As further discussed in the corresponding description of FIG. 2, the shadowing effect of the inorganic overhang structures 110 define the OLED angle $\theta_{OLED}$ (shown in FIG. 2) of the OLED material 112 and the cathode angle $\theta_{cathode}$ (shown in FIG. 2) of the cathode 114. The OLED angle $\theta_{OLED}$ of the OLED material 112 and the cathode angle $\theta_{cathode}$ of the cathode 114 result from evaporation deposition of the OLED material 112 and the cathode 114. In the first and second configurations, the OLED material 112 does not contact and the cathode 114 contacts the lower portion 110A of the inorganic overhang structures 110. In the third and fourth configurations, the OLED material 112 does not contact the lower portion 110A and the assistant cathode 202, and the cathode 114 contacts at least the assistant cathode 202. The encapsulation layer 116 is deposited over the cathode 114.

Figure 7E:
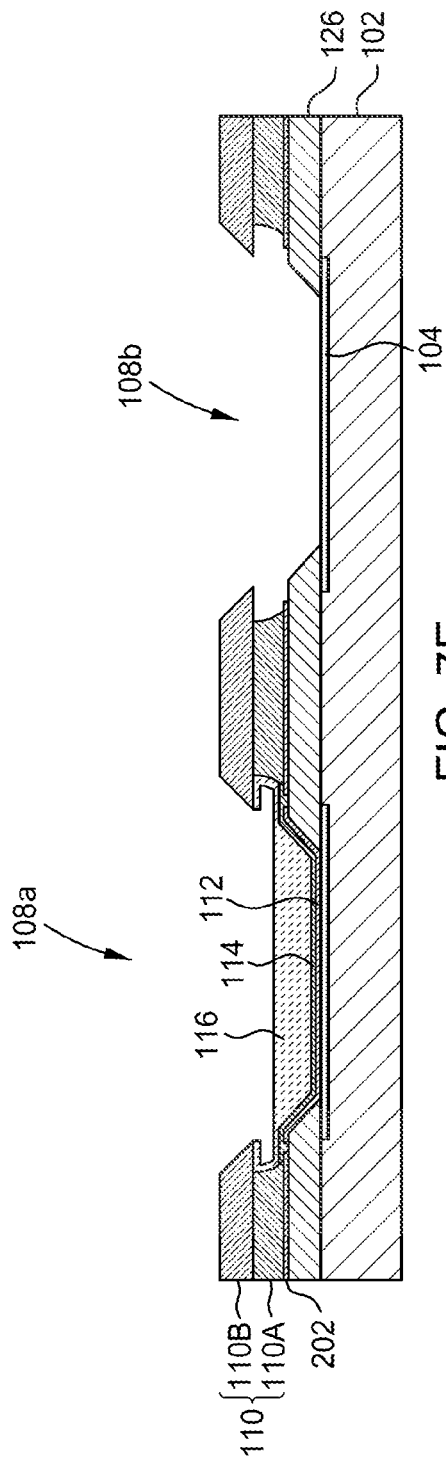
Figure 7F:
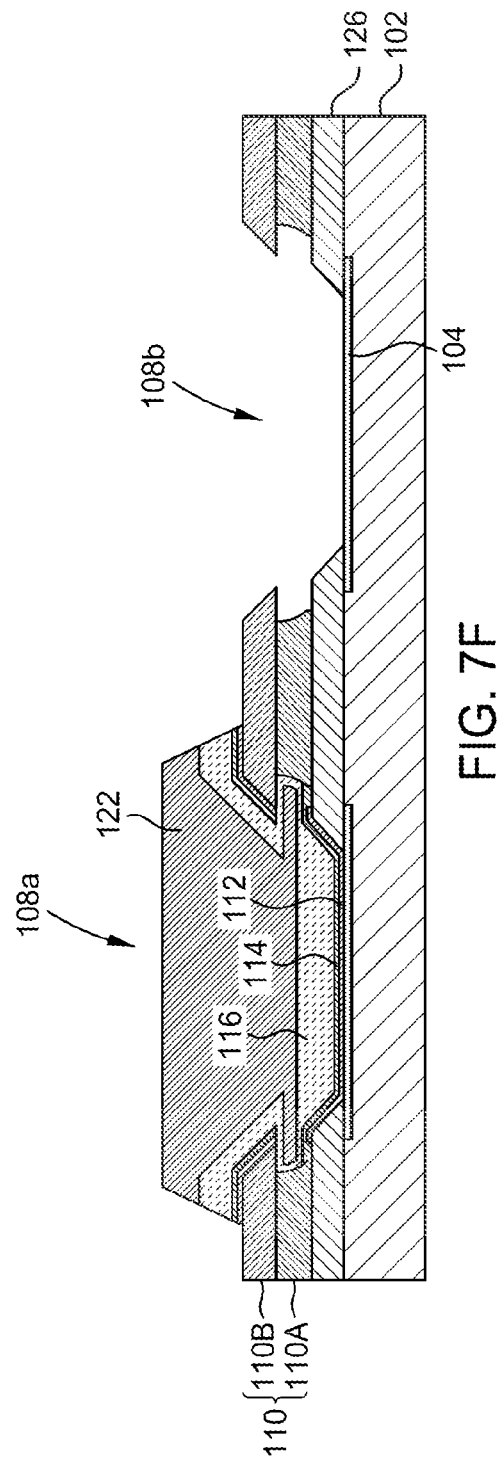

At operation 603, as shown in FIG. 7C, a resist 702 is formed in a well 704 of the first sub-pixel 108a. At operation 604, as shown in FIGS. 7E and 7F, the encapsulation layer 116, the cathode 114, and the OLED material 112 exposed by the resist 702 are removed. The encapsulation layer 116, the cathode 114, and the OLED material 112 exposed by resist 702 may be removed by wet etch processes. According to embodiments with the plugless arrangement 101A of the sub-pixel circuit 100, the resist 408 is removed, as shown in FIG. 7E. According to embodiments with the plug arrangement 101B of the sub-pixel circuit 100, the resist 702 is corresponds to the plug 122 of the first sub-pixel 108a, as shown in FIGS. 7D and 7F.

Figure 7G:
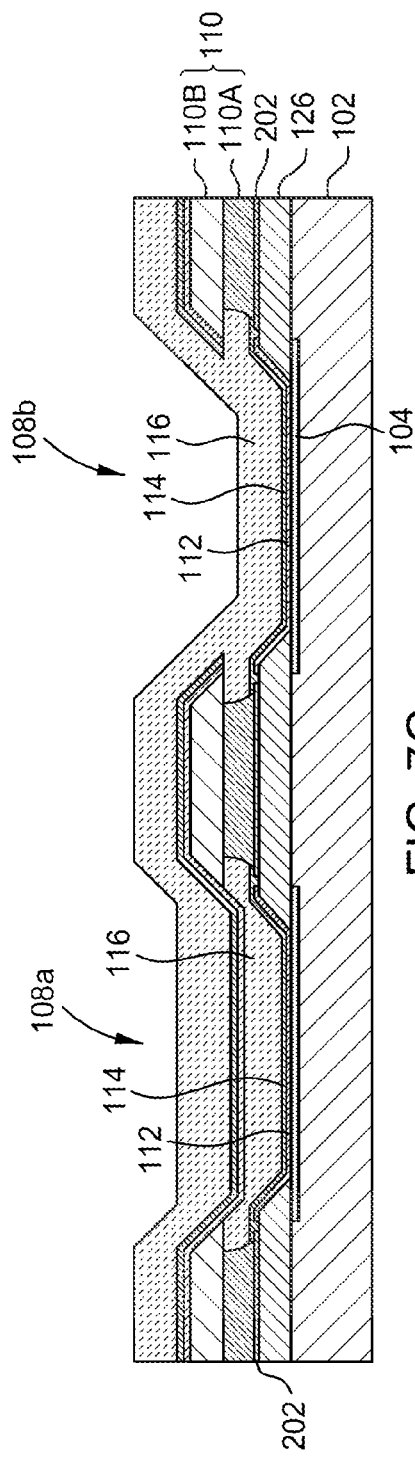
Figure 7H:
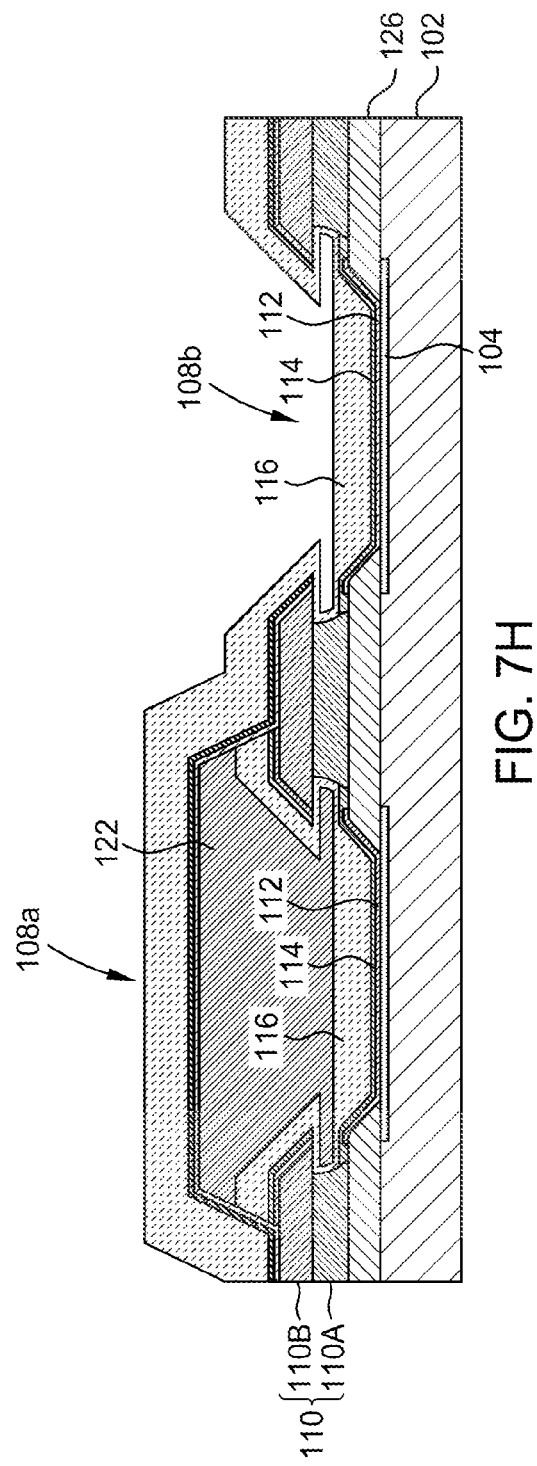

At operation 605, as shown in FIGS. 7G and 7H, the OLED material 112 of the second sub-pixel 108b, the cathode 114, and the encapsulation layer 116 are deposited. In embodiments including capping layers, the capping layers are deposited between the cathode 114 and the encapsulation layer 116. The capping layers may be deposited by evaporation deposition. The shadowing of the overhang 109 provides for evaporation deposition each of the OLED material 112 and a cathode 114. As further discussed in the corresponding description of FIG. 2, the shadowing effect of the inorganic overhang structures 110 define the OLED angle $\theta_{OLED}$ (shown in FIG. 2) of the OLED material 112 and the cathode angle $\theta_{cathode}$ (shown in FIG. 2) of the cathode 114. The OLED angle $\theta_{OLED}$ of the OLED material 112 and the cathode angle $\theta_{cathode}$ of the cathode 114 result from evaporation deposition of the OLED material 112 and the cathode 114. In the first and second configurations, the OLED material 112 does not contact and the cathode 114 contacts the lower portion 110A of the inorganic overhang structures 110. In the third and fourth configurations, the OLED material 112 does not contact the lower portion 110A and the assistant cathode 202, and the cathode 114 contacts at least the assistant cathode 202. The encapsulation layer 116 is deposited over the cathode 114.

At operation 606, as shown in FIG. 4L, a resist 704 is formed in a well 706 of the second sub-pixel 108b. At operation 607, as shown in FIGS. 7K and 7L, the encapsulation layer 116, the cathode 114, and the OLED material 112 exposed by the resist 416 are removed. The encapsulation layer 116, the cathode 114, and the OLED material 112 exposed by resist 706 may be removed by wet etch processes. According to embodiments with the plugless arrangement 101A of the sub-pixel circuit 100, the resist 706 is removed, as shown in FIG. 7K. According to embodiments with the plug arrangement 101B of the sub-pixel circuit 100, the resist 706 corresponds to the plug 122 of the second sub-pixel 108b, as shown in FIGS. 7J and 7L. Operations 601-607 described herein form the sub-pixel circuit 100 including two or more sub-pixels 106. Operations 605-607 may be repeated for each addition sub-pixel, e.g. for a third and/or a fourth sub-pixel.

In summation, described herein relate to sub-pixel circuits and methods of forming sub-pixel circuits that may be utilized in a display such as an organic light-emitting diode (OLED) display. The adjacent inorganic overhang structures defining each sub-pixel of the sub-pixel circuit of the display provide for formation of the sub-pixel circuit using evaporation deposition and provide for the inorganic overhang structures to remain in place after the sub-pixel circuit is formed (e.g., utilizing the methods of the fifth, sixth, or seventh exemplary embodiments). Evaporation deposition may be utilized for deposition of an OLED material and cathode. The inorganic overhang structures define deposition angles, i.e., provide for a shadowing effect during evaporation deposition, for each of the OLED material and the cathode such the OLED material does not contact the lower portion (and assistant cathode according to embodiments with the third and fourth configurations) and the cathode contacts the lower portion according to the first and second configurations or at least the assistant cathode of the third and fourth configurations. The encapsulation layer of a respective sub-pixel is disposed over the cathode with the encapsulation layer extending under at least a portion of each of the adjacent inorganic overhang structures and along a sidewall of each of the adjacent inorganic overhang structures.

While the foregoing is directed to embodiments of the present disclosure, other and further embodiments of the disclosure may be devised without departing from the basic scope thereof, and the scope thereof is determined by the claims that follow.

What is claimed is:
1. A device, comprising:
   a substrate;
   a plurality of overhang structures, the overhang structures having an upper portion having a bottom surface wider than a top surface of a lower portion, adjacent overhang structures defining wells of sub-pixels of the device; and a plurality of sub-pixels, each sub-pixel comprising:
an anode;
an organic light-emitting diode (OLED) material disposed over the anode;
a cathode disposed over the OLED material;
first encapsulation layer disposed over the cathode and past an endpoint of the cathode, wherein the first encapsulation layer extends under at least a portion of the overhang structures along a sidewall of the lower portion and contacts the bottom surface of the upper portion of the overhang structures; and
a second encapsulation layer disposed over the first encapsulation layer, wherein the second encapsulation layer is disposed within a well of each sub-pixel and directly on the upper portion of the overhang structures.

2. The device of claim 1, wherein the first encapsulation layer further extends along a sidewall of the upper portion.

3. The device of claim 2, wherein the first encapsulation layer further extends over an upper surface of the upper portion.

4. The device of claim 1, wherein the upper portion includes an underside edge extending past the sidewall of the lower portion.

5. The device of claim 4, wherein the first encapsulation layer contacts the underside edge of the upper portion.

6. The device of claim 1, wherein the device comprises a dot-type architecture or a line-type architecture.

7. The device of claim 1, wherein the overhang structures comprise a non-conductive inorganic material.

8. The device of claim 7, wherein the non-conductive inorganic material comprises an inorganic silicon-containing material.

9. The device of claim 1, wherein the overhang structures comprise a conductive inorganic material.

10. The device of claim 9, wherein the conductive inorganic material comprises a metal-containing material.

11. The device of claim 10, wherein the metal-containing material comprises copper, titanium, aluminum, molybdenum, silver, indium tin oxide, indium zinc oxide, or combinations thereof.

12. A device, comprising:
a substrate,
a plurality of overhang structures, the overhang structures defining wells of sub-pixels of the device;
an organic light-emitting diode (OLED) material disposed on a top surface of the overhang structures and between adjacent overhang structures;
a cathode disposed over the OLED material disposed over the top surface of the overhang structures and between the adjacent overhang structures;
first encapsulation layer disposed over the cathode and past an endpoint of the cathode, wherein the first encapsulation layer extends under at least a portion of the overhang structures, contacts a sidewall of the overhang structures, and is disposed over the top surface of the overhang structures; and
a second encapsulation layer disposed over the first encapsulation layer, wherein the second encapsulation layer is disposed within a well of each sub pixel and directly on the top surface of the overhang structures.

13. The device of claim 12, wherein the overhang structures comprise an inorganic silicon-containing material.

14. The device of claim 12, wherein the overhang structures comprise a metal-containing material.

15. The device of claim 12, wherein the first encapsulation layer separates the OLED material and the cathode between the adjacent overhang structures from the OLED material and the cathode disposed over the top surface of the overhang structures.

16. The device of claim 12, wherein the OLED material comprises a hole injection layer (HIL), a hole transport layer (HTL), an emissive layer (EML), and an electron transport layer (ETL).

17. A device, comprising:
a substrate; and
a plurality of overhang structures disposed over the substrate, the overhang structures defining wells therebetween, the wells correspond to sub-pixels of the device, each well comprising:
an organic light-emitting diode (OLED) material;
a cathode disposed over the OLED material;
first encapsulation layer disposed over the cathode and past an endpoint of the cathode, wherein the first encapsulation layer extends under at least a portion of the overhang structures, contacts a sidewall of the overhang structures, and is disposed over a top surface of the overhang structures; and
a second encapsulation layer disposed over the first encapsulation layer, wherein the second encapsulation layer is disposed within a respective well of each sub pixel and directly on the top surface of the overhang structures.

\* \* \* \* \*